United States Patent
Shao et al.

(10) Patent No.: US 12,557,272 B2
(45) Date of Patent: Feb. 17, 2026

(54) SEMICONDUCTOR STRUCTURE AND METHOD FOR MANUFACTURING SAME

(71) Applicants: CHANGXIN MEMORY TECHNOLOGIES, INC., Hefei (CN); BEIJING SUPERSTRING ACADEMY OF MEMORY TECHNOLOGY, BeiJing (CN)

(72) Inventors: Guangsu Shao, Hefei (CN); Deyuan Xiao, Hefei (CN); Weiping Bai, Hefei (CN); Yunsong Qiu, Hefei (CN)

(73) Assignees: CHANGXIN MEMORY TECHNOLOGIES, INC., Hefei (CN); BEIJING SUPERSTRING ACADEMY OF MEMORY TECHNOLOGY, Beijing (CN)

( * ) Notice: Subject to any disclaimer, the term of this patent is extended or adjusted under 35 U.S.C. 154(b) by 408 days.

(21) Appl. No.: 18/177,076

(22) Filed: Mar. 1, 2023

(65) Prior Publication Data

US 2023/0209811 A1 Jun. 29, 2023

Related U.S. Application Data

(63) Continuation of application No. PCT/CN2022/078723, filed on Mar. 2, 2022.

(30) Foreign Application Priority Data

Aug. 25, 2021 (CN) .......................... 202110984556.9

(51) Int. Cl.
H10B 12/00 (2023.01)
(52) U.S. Cl.
CPC ........... *H10B 12/482* (2023.02); *H10B 12/05* (2023.02); *H10B 12/315* (2023.02)

(58) Field of Classification Search
CPC .... H10B 12/482; H10B 12/05; H10B 12/315; H10B 12/488; H10B 12/033; H01L 21/764
See application file for complete search history.

(56) References Cited

U.S. PATENT DOCUMENTS 6,312,982 B1 * 11/2001 Takato ................... H10B 12/09
257/E21.654
9,691,773 B2 6/2017 Surthi
(Continued)

FOREIGN PATENT DOCUMENTS

| CN | 104617096 A | 5/2015 |
| CN | 108735816 A | 11/2018 |

(Continued)

OTHER PUBLICATIONS

Supplementary European Search Report in the European application No. 22765734.3, mailed on Aug. 23, 2023. 7 pages.

(Continued)

*Primary Examiner* — Yasser A Abdelaziez
(74) *Attorney, Agent, or Firm* — Syncoda LLC; Feng Ma

(57) ABSTRACT

A method for manufacturing a semiconductor structure includes: forming first shallow trench isolation structures in a substrate, which isolate a plurality of active areas extending in first direction in the substrate, in which a first shallow trench isolation structure includes a sacrificial layer and a first dielectric layer stacked from bottom up in sequence; forming a plurality of word line isolation grooves in the substrate, in which a word line isolation groove is located above the sacrificial layer and extends in second direction; forming a second dielectric layer on sidewalls of the word line isolation groove, in which a pore penetrating to the substrate is provided inside the second dielectric layer; metallizing a lower part of an active area based on the pore (Continued)

to form a bit line extending in first direction; and removing the sacrificial layer based on the pore to form an air gap between adjacent bit lines.

5 Claims, 57 Drawing Sheets

(56) References Cited

U.S. PATENT DOCUMENTS

| | | | |
|---|---|---|---|
| 10,622,249 B2 | 4/2020 | Yoon | |
| 10,923,390 B2 | 2/2021 | Yoon | |
| 11,139,302 B2 | 10/2021 | Sukekawa | |
| 2009/0236656 A1* | 9/2009 | Sung | H10B 12/488 257/329 |
| 2012/0033501 A1* | 2/2012 | Park | H10B 43/27 365/185.18 |
| 2012/0211815 A1* | 8/2012 | Mikasa | H10B 12/053 257/306 |
| 2013/0146958 A1 | 6/2013 | Kim | |
| 2014/0175555 A1 | 6/2014 | Lee | |
| 2014/0353745 A1 | 12/2014 | Kim | |
| 2015/0123280 A1 | 5/2015 | Surthi et al. | |
| 2016/0284710 A1 | 9/2016 | Kim | |
| 2018/0053770 A1 | 2/2018 | Kim | |
| 2018/0301556 A1 | 10/2018 | Yeh | |
| 2019/0103302 A1 | 4/2019 | Yoon | |
| 2020/0203213 A1 | 6/2020 | Yoon | |
| 2020/0388619 A1 | 12/2020 | Sukekawa et al. | |
| 2021/0134808 A1* | 5/2021 | Kim | H10B 12/053 |
| 2023/0292500 A1* | 9/2023 | Choi | H10B 20/60 |

FOREIGN PATENT DOCUMENTS

| | | |
|---|---|---|
| CN | 108807401 A | 11/2018 |
| CN | 109979940 A | 7/2019 |
| CN | 111564442 A | 8/2020 |
| CN | 112071839 A | 12/2020 |
| TW | 201214630 A | 4/2012 |
| TW | I596775 B | 8/2017 |
| TW | 202117939 A | 5/2021 |
| TW | I726738 B | 5/2021 |
| TW | I732588 B | 7/2021 |

OTHER PUBLICATIONS

International Search Report in the international application No. PCT/CN2022/078723, mailed on May 7, 2022.
FUBU Wushi, "List of advanced CMOS processes below 7nm", Encyclopedia of Semiconductors, http://www.semiinsights.com/s/electronic_components/23/39893.shtml.
Kangguo Cheng, et, al. "Improved Air Spacer Co-Integrated with Self-Aligned Contact (SAC) and Contact Over Active Gate (COAG) for Highly Scaled CMOS Technology", 978-1-7281-6460-1/20/$31.00 © 2020 IEEE.
M. Togo, et, al. "A Gate-side Air-gap Structure (GAS) to Reduce the Parasitic Capacitance in MOSFETs", 0-7803-3342-X/96/$5 0001 996 IEEE, 1996 Symposium on VLSI Technology Digest of Technical Papers.
Jemin Park, et, al. "Air Spacer MOSFET Technology for 20nm Node and Beyond", 978-1-4244-2186-2/08/$25.00 © 2008 IEEE.
K. Cheng, et, al. "Air Spacer for 10nm FinFET CMOS and Beyond", 978-1-5090-3902-9/16/$31.00 © 2016 IEEE.

* cited by examiner

A-A'

B-B'

D-D'

D-D'

D-D'

D-D'

D-D'

SEMICONDUCTOR STRUCTURE AND METHOD FOR MANUFACTURING SAME

CROSS-REFERENCE TO RELATED APPLICATIONS

This is a continuation of International Patent Application No. PCT/CN2022/078723 filed on Mar. 2, 2022, which claims priority to Chinese Patent Application No. 202110984556.9 filed on Aug. 25, 2021. The disclosures of the above-referenced applications are hereby incorporated by reference in their entirety.

BACKGROUND

Dynamic Random Access Memory (DRAM) is a semiconductor memory commonly used in electronic devices such as computers, which consists of multiple memory cells. A memory cell includes a storage capacitor and a transistor electrically connected to the storage capacitor. The transistor includes a gate, a source area and a drain area. The gate of the transistor is used to be electrically connected to a word line. The source area of the transistor is used to form a bit line contact area, so that it is electrically connected to a bit line by a bit line contact structure. The drain area of the transistor is used to form a storage node contact area, so that it is electrically connected to the storage capacitor by a storage node contact structure.

However, as the size of DRAM is shrinking, the use of a vertical gate all around transistor (VGAA transistor for short) as the transistor can effectively reduce the size of DRAM, but it also easily leads to the coupling of a bit line and a word line which are connected to the transistor, which leads to a large parasitic capacitance between the lines of the DRAM, thereby adversely affecting the electrical property of the DRAM.

SUMMARY

The disclosure relates to the technical field of manufacturing semiconductor integrated circuits, and in particular to a semiconductor structure and a method for manufacturing the same.

A method for manufacturing a semiconductor structure includes the following operations.

First shallow trench isolation structures are formed in a substrate A first shallow trench isolation structure includes a sacrificial layer and a first dielectric layer which are stacked from bottom up in sequence. The first shallow trench isolation structures isolate a plurality of active areas in the substrate. The active areas extend in a first direction.

A plurality of word line isolation grooves are formed in the substrate. A word line isolation groove is located above the sacrificial layer and extends in a second direction. The second direction intersects with the first direction.

A second dielectric layer is formed on sidewalls of the word line isolation groove. A pore penetrating to the substrate is provided inside the second dielectric layer.

A lower part of an active area is metallized based on the pore to form a bit line which extends in the first direction.

The sacrificial layer is removed based on the pore to form an air gap between adjacent bit lines.

A semiconductor structure includes a substrate and a plurality of bit lines. A plurality of active areas arranged at intervals are provided in the substrate. The active areas extend in a first direction. The plurality of bit lines are arranged at intervals in parallel at lower parts of the active areas, and an air gap is provided between adjacent bit lines.

BRIEF DESCRIPTION OF THE DRAWINGS

In order to more clearly illustrate the technical solutions of the embodiments of this disclosure or the related art, the drawings needed to be used in the description of the embodiments or the related art will be briefly introduced herein below. It is apparent that the drawings in the following description are only some embodiments of this disclosure, and for an ordinary person skilled in the art, other drawings may also be obtained according to these drawings without making creative efforts.

FIG. 17A is also a schematic structural diagram along the A-A' line of a semiconductor structure provided by an embodiment; FIG. 17B is also a schematic structural diagram along the C-C' line of a semiconductor structure provided by an embodiment.

DETAILED DESCRIPTION

Figure 1:
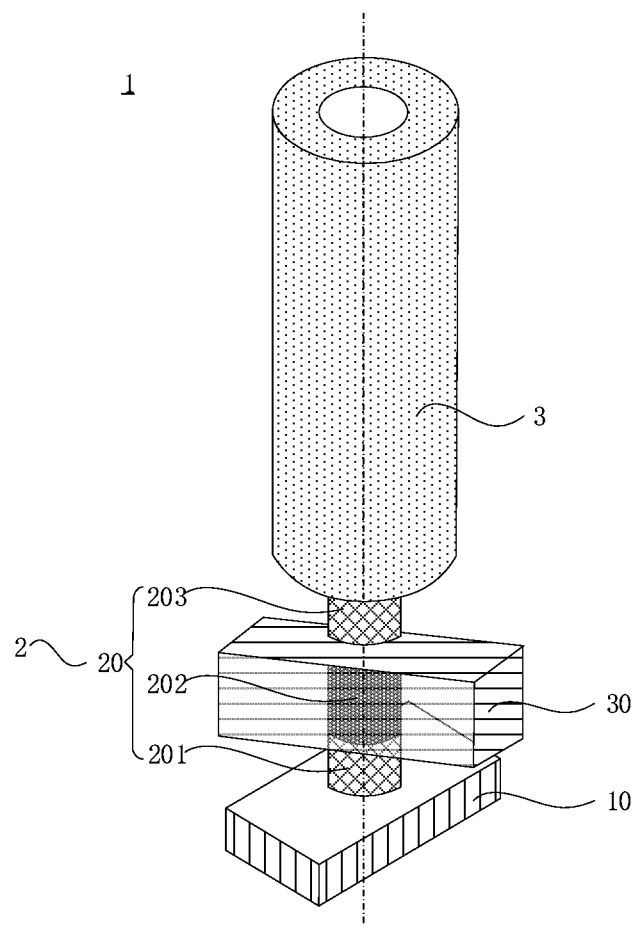
FIG. 1 is a stereoscopic view of a memory cell provided by an embodiment.

In order to facilitate the understanding of this disclosure, the disclosure will be more fully described below with reference to the relevant drawings. Embodiments of the present disclosure are shown in the drawings. However, this disclosure may be implemented in many different forms and is not limited to the embodiments described herein. On the contrary, these embodiments are provided to make the disclosure of this application more thorough and comprehensive.

Unless otherwise defined, all technical and scientific terms used herein have the same meanings as commonly understood by those skilled in the technical field of this disclosure. The terms used in the specification of this disclosure are only for the purpose of describing specific embodiments, and are not intended to limit this disclosure.

It should be understood that when an element or layer is referred to as being "on", "adjacent to", "connected to" or "coupled to" another element or layer, it may be directly on, adjacent to, connected to or coupled to another element or layer, or an intervening element or layer may exist. On the contrary, when an element is referred to as being "directly on", "directly adjacent to", "directly connected to" or "directly coupled to" another element or layer, there is no intervening element or layer.

It should be understood that although the terms first, second, etc. may be used to describe various elements, components, areas, layers, doping types and/or portions, these elements, components, areas, layers, doping types and/or portions should not be limited by these terms. These terms are only used to distinguish one element, component, area, layer, doping type or portion from another element, component, area, layer, doping type or portion. Therefore, without departing from the teachings of the present disclosure, a first element, component, area, layer, doping type or portion discussed below may be represented as a second element, component, area, layer or portion.

Spatial relation terms such as "under", "below", "lower", "beneath", "on" and "upper" etc. may be used here for describing the relationship between one element or feature and another element or feature shown in the drawings. It should be understood that in addition to the orientations shown in the drawings, the spatial relationship terms are intended to include different orientations of devices in use and operation. For example, if the device in the drawings is turned upside down, then an element or feature described as being "under" or "beneath" or "below" another element or feature will be oriented "on" another element or feature. Therefore, the exemplary terms "below" and "under" may include two orientations, on and under. In addition, the device may also include another orientation (for example, rotated by 90 degrees or other orientations), and the spatial description used here is interpreted accordingly.

As used herein, the singular forms "an", "a" and "said/the" may also include plural forms, unless the context clearly indicates otherwise. It should also be understood that the terms "include/comprise" or "have" etc. specify the presence of stated features, integers, steps, operations, components, portions or their combinations, but do not exclude the possibility of the presence or addition of one or more other features, integers, steps, operations, components, portions or their combinations. Moreover, in this specification, the term "and/or" includes any and all combinations of related listed items.

The embodiments of the disclosure are described here with reference to cross-sectional views that are schematic diagrams of ideal embodiments (and intermediate structures) of the disclosure, so that changes in the shown shapes due to, for example, manufacturing techniques and/or tolerances can be expected. Therefore, the embodiments of the present disclosure should not be limited to the specific shapes of the areas shown here, but include shape deviations due to, for example, the manufacturing techniques. The areas shown in the drawings are schematic in nature, and their shapes do not represent the actual shapes of the areas of the device, and do not limit the scope of the present disclosure.

A gate all around transistor has more advantages in miniaturization, high performance and low power consumption, etc., and is considered as a key core technology of the next generation integrated circuit. Taking a vertical gate all around transistor as an example, this transistor has more integration freedom in the vertical direction. As a result, its plane area can be effectively reduced, and it also is easier to realize the vertical stacking of multilayer devices and further increase an integration density by a brand-new wiring way.

Referring to FIG. 1, some embodiments of the present disclosure provide a semiconductor structure, which includes, for example, a memory cell 1 of a DRAM. The memory cell 1 includes a vertical gate all around transistor 2, and a storage capacitor 3 located on and connected to the vertical gate all around transistor 2. The vertical gate all around transistor 2 includes a columnar structure 20 including a source 201, a conductive channel 202, and a drain 203 arranged from bottom up. The source 201 is connected to a bit line 10. The drain 203 is connected to the storage capacitor 3. A gate word line 30 is disposed at the periphery of the conductive channel 202, and a gate dielectric layer (not shown in FIG. 1) is disposed between the conductive channel 202 and the gate word line 30. A portion of the gate word line 30 located on the peripheral side of the conductive channel 202 may be used as a gate of the vertical gate all around transistor 2.

Figure 2:
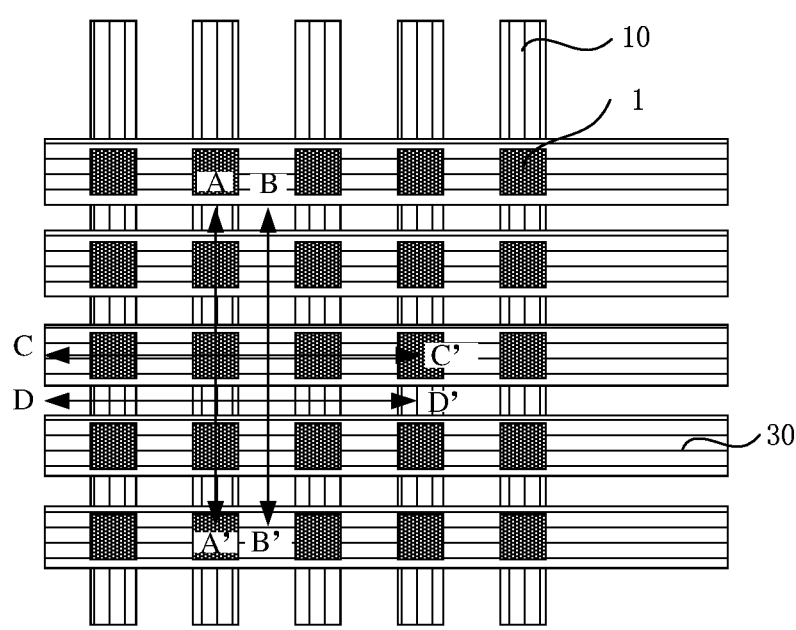
FIG. 2 is a schematic diagram of a distribution of bit lines and word lines of a semiconductor structure provided by an embodiment.

What needs to be added is that, referring to FIGS. 1 and 2, the memory cells 1 described above may be distributed in an array on a substrate, and the memory cells 1 in each row are correspondingly connected to one gate word line 30, and the memory cells 1 in each column are connected to one bit line 10 to form the semiconductor structure. A plurality of gate word lines 30 are distributed in parallel at intervals, and a plurality of bit lines 10 are distributed in parallel at intervals.

Figure 3:
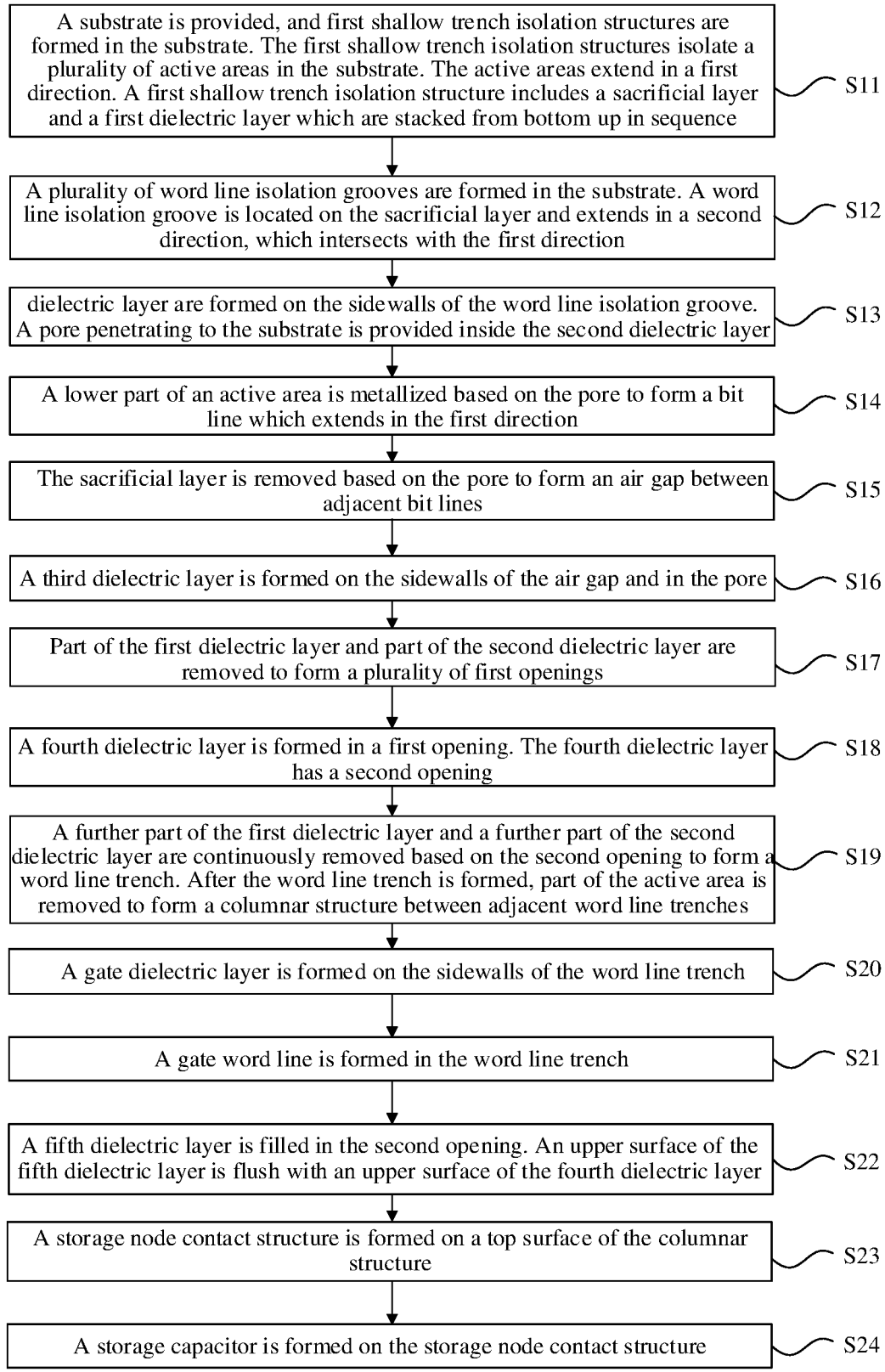
FIG. 3 is a flowchart of a method for manufacturing a semiconductor structure provided by an embodiment.
Figure 4A:
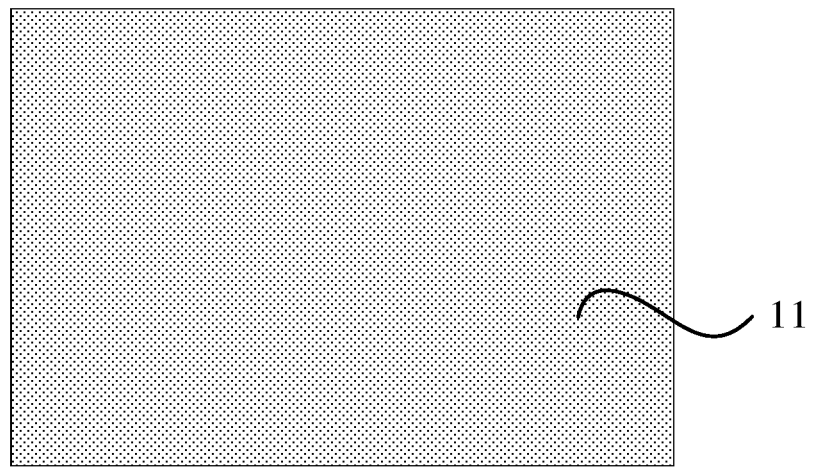
FIG. 4A is a cross-sectional view along the A-A' line of a structure, which is obtained after first shallow trench isolation structures are formed at S11 provided by an embodiment.
Figure 4B:
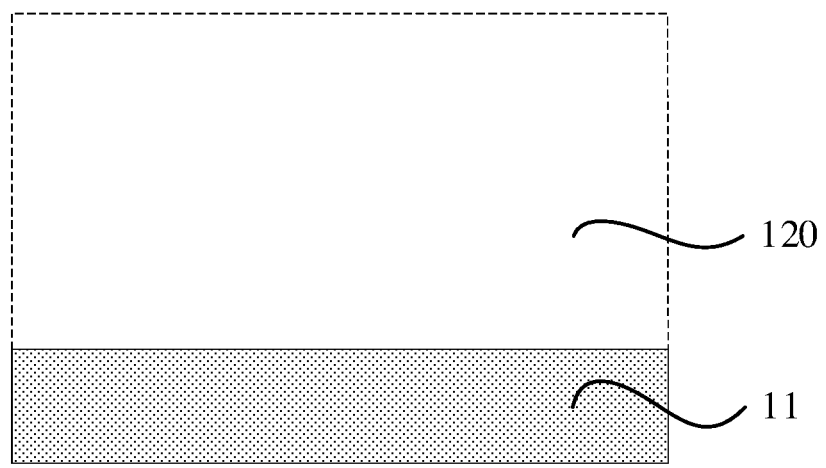
FIG. 4B is a cross-sectional view along the B-B' line of a structure, which is obtained after first shallow trench isolation structures are formed at S11 provided by an embodiment.
Figure 4C:
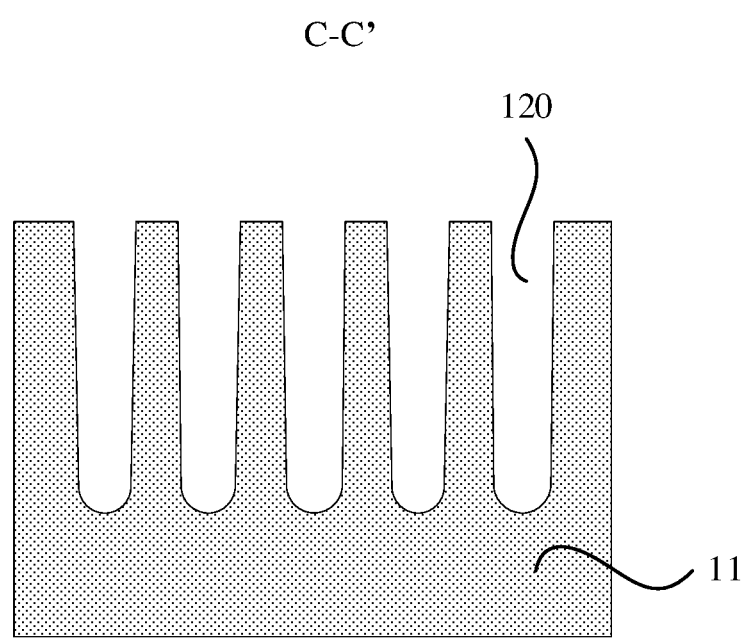
FIG. 4C is a cross-sectional view along the C-C' line of a structure, which is obtained after first shallow trench isolation structures are formed at S11 provided by an embodiment.
Figure 4D:
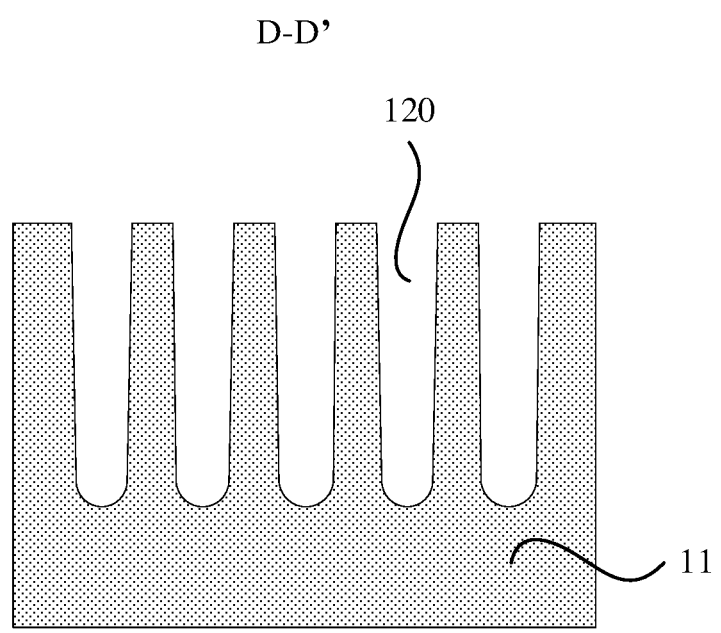
FIG. 4D is a cross-sectional view along the D-D' line of a structure, which is obtained after first shallow trench isolation structures are formed at S11 provided by an embodiment.
Figure 5A:
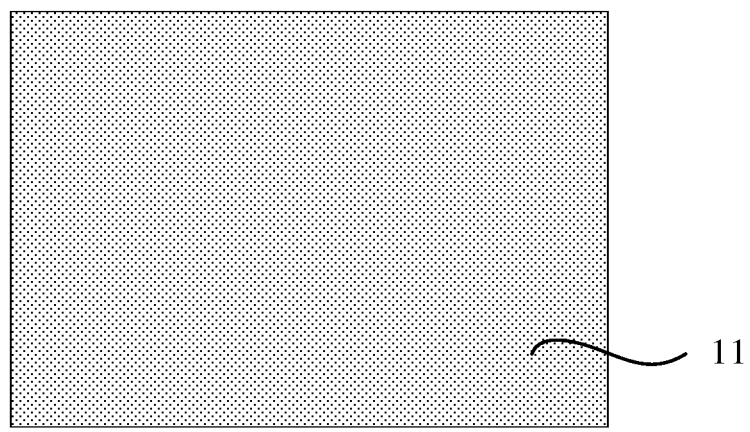
FIG. 5A is a cross-sectional view along the A-A' line of a structure, which is obtained at S11 provided by an embodiment.
Figure 5B:
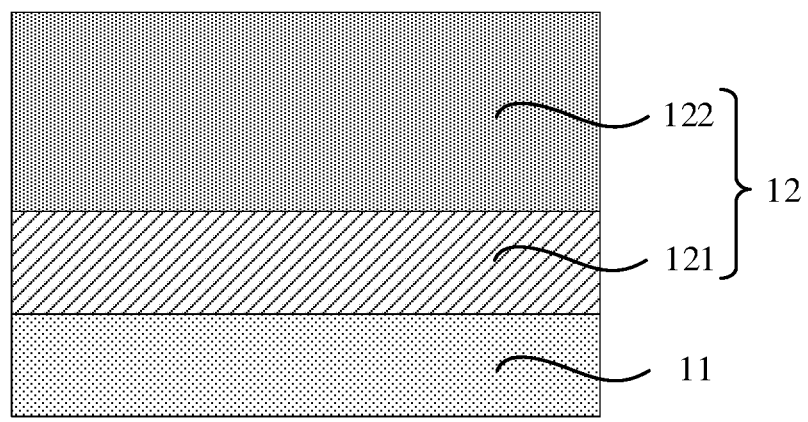
FIG. 5B is a cross-sectional view along the B-B' line of a structure, which is obtained at S11 provided by an embodiment.
Figure 5C:
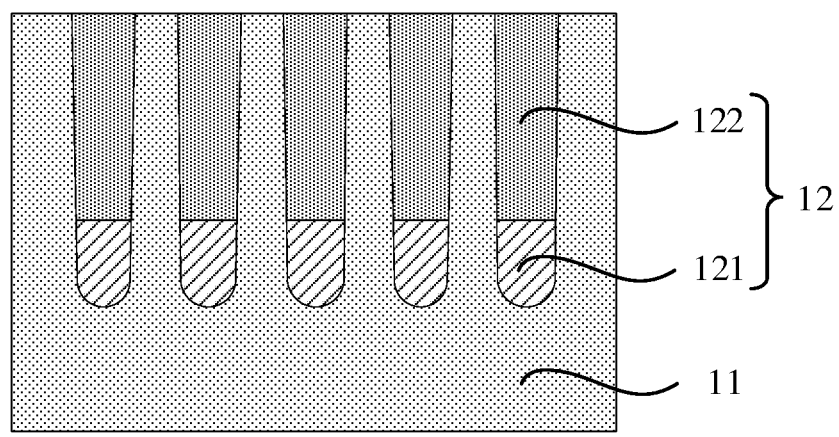
FIG. 5C is a cross-sectional view along the C-C' line of a structure, which is obtained at S11 provided by an embodiment.
Figure 5D:
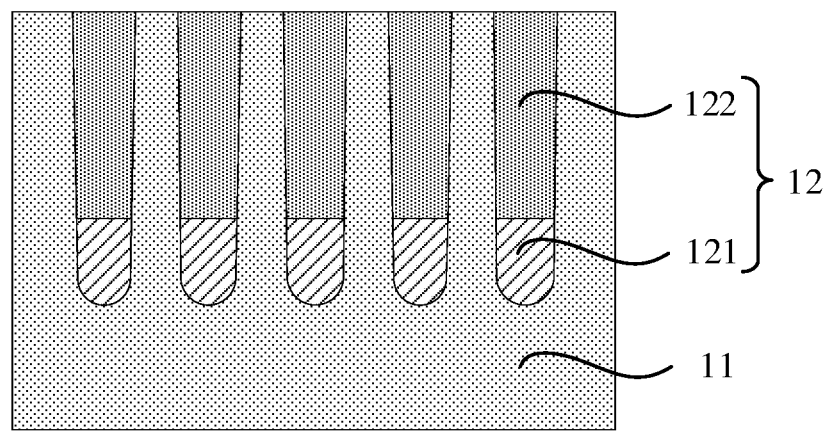
FIG. 5D is a cross-sectional view along the D-D' line of a structure, which is obtained at S11 provided by an embodiment.
Figure 6A:
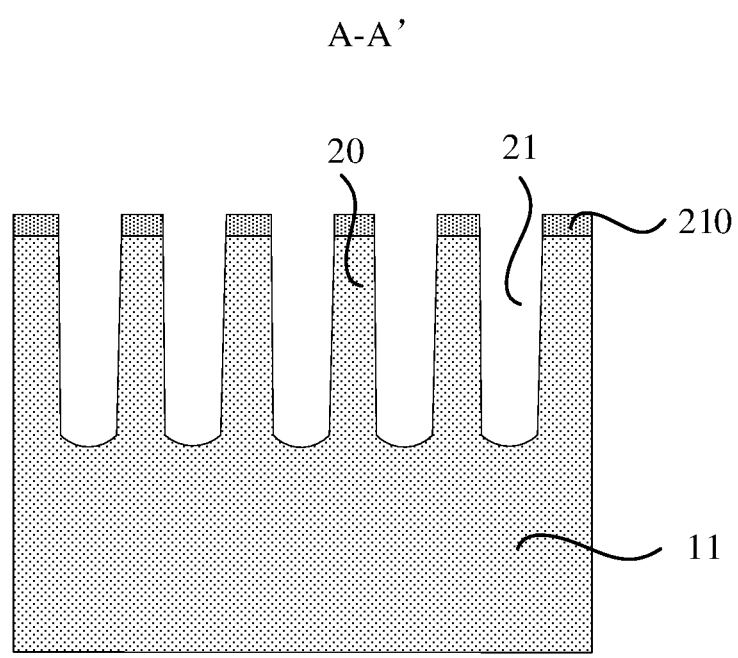
FIG. 6A is a cross-sectional view along the A-A' line of a structure, which is obtained at S12 provided by an embodiment.
Figure 6B:
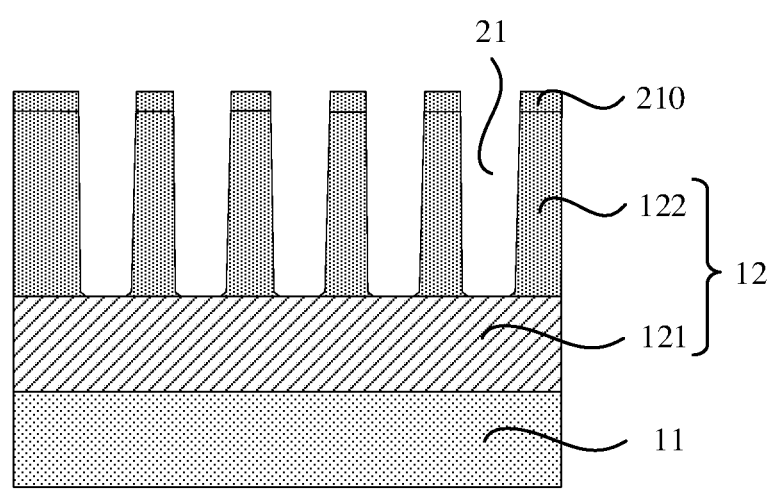
FIG. 6B is a cross-sectional view along the B-B' line of a structure, which is obtained at S12 provided by an embodiment.
Figure 6C:
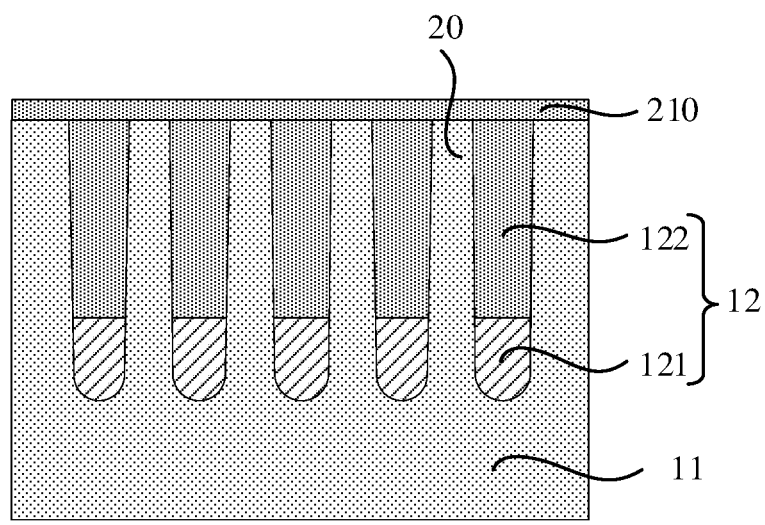
FIG. 6C is a cross-sectional view along the C-C' line of a structure, which is obtained at S12 provided by an embodiment.
Figure 6D:
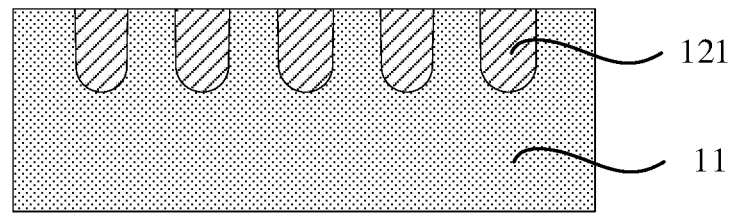
FIG. 6D is a cross-sectional view along the D-D' line of a structure, which is obtained at S12 provided by an embodiment.
Figure 7A:
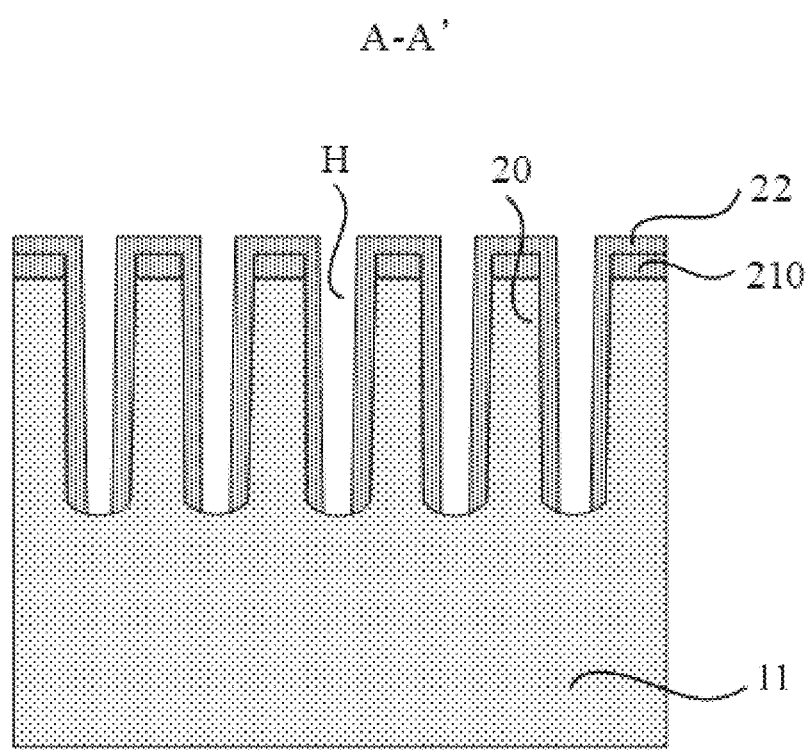
FIG. 7A is a cross-sectional view along the A-A' line of a structure obtained at S13 provided by an embodiment.
Figure 7B:
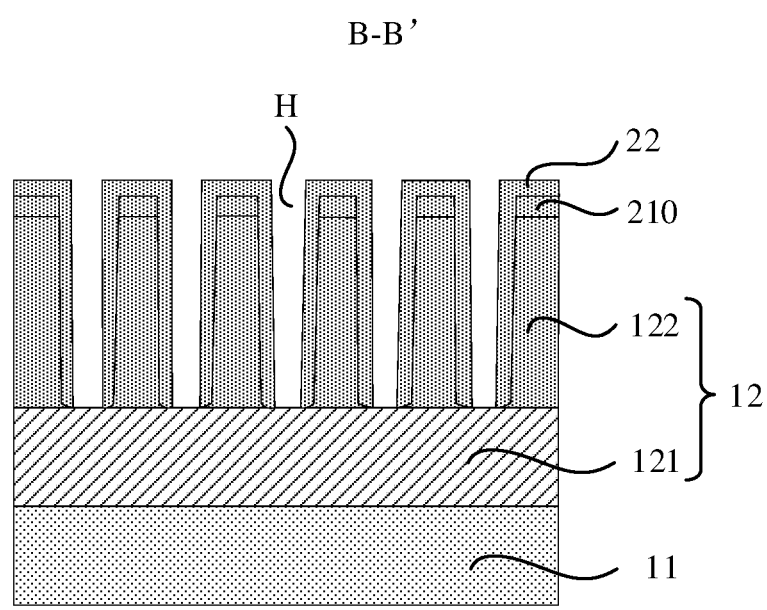
FIG. 7B is a cross-sectional view along the B-B' line of a structure obtained at S13 provided by an embodiment.
Figure 7C:
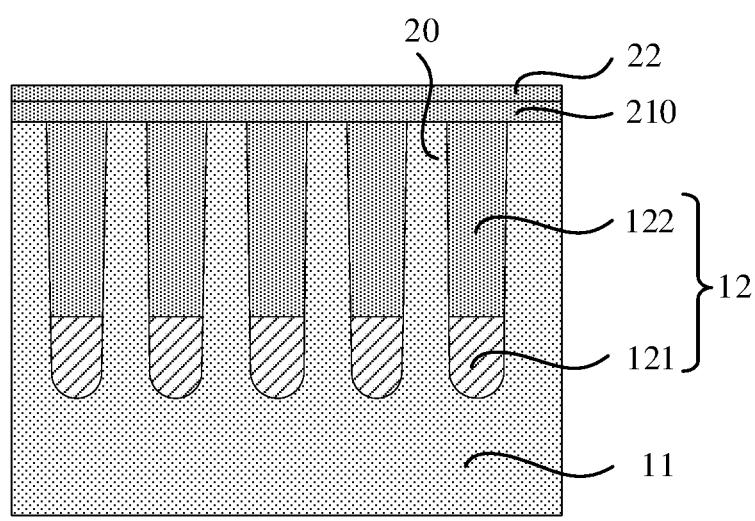
FIG. 7C is a cross-sectional view along the C-C' line of a structure obtained at S13 provided by an embodiment.
Figure 7D:
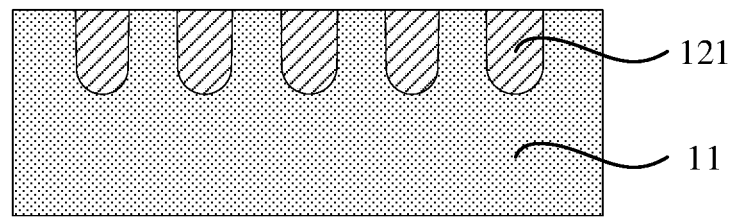
FIG. 7D is a cross-sectional view along the D-D' line of a structure obtained at S13 provided by an embodiment.
Figure 8A:
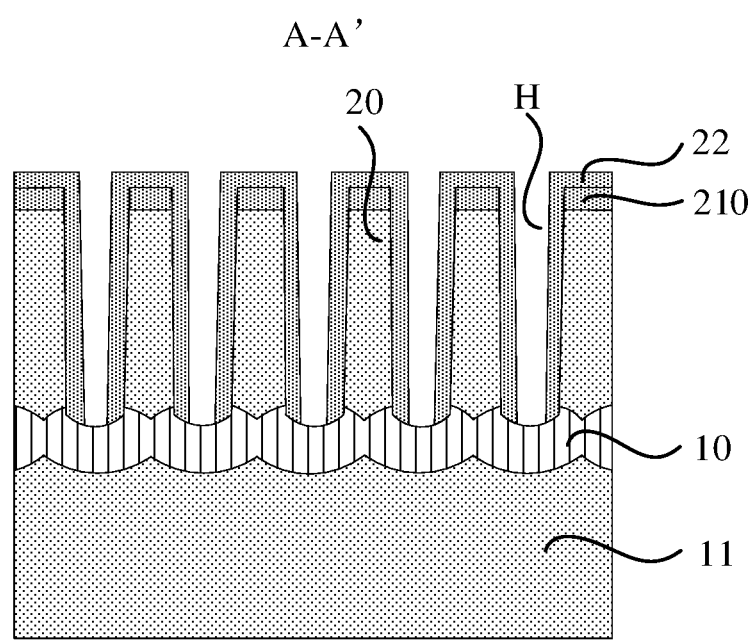
FIG. 8A is a cross-sectional view along the A-A' line of a structure obtained at S14 provided by an embodiment.
Figure 8B:
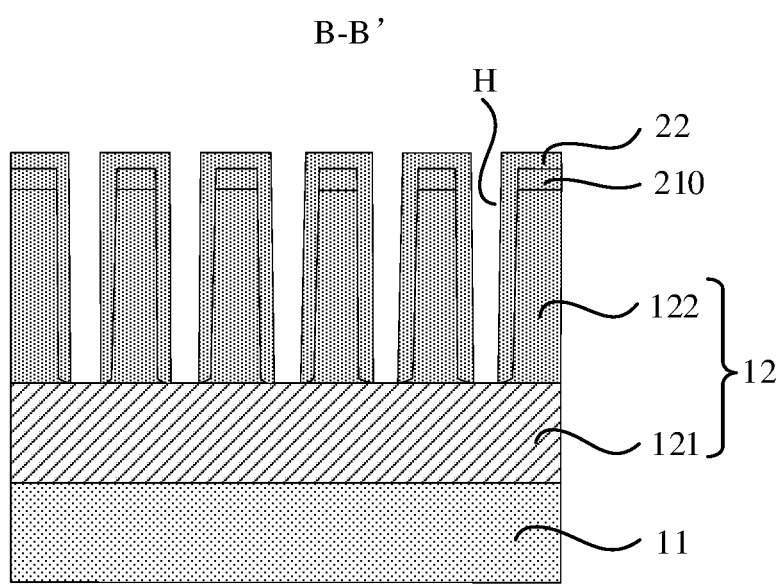
FIG. 8B is a cross-sectional view along the B-B' line of a structure obtained at S14 provided by an embodiment.
Figure 8C:
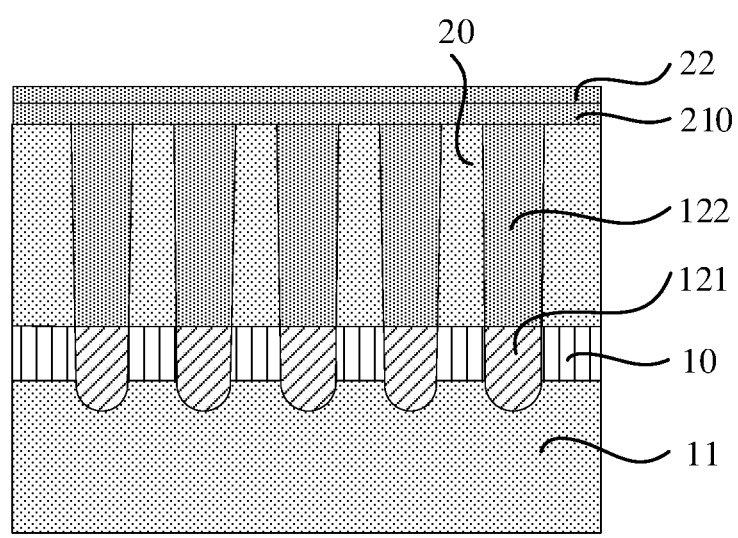
FIG. 8C is a cross-sectional view along the C-C' line of a structure obtained at S14 provided by an embodiment.
Figure 8D:
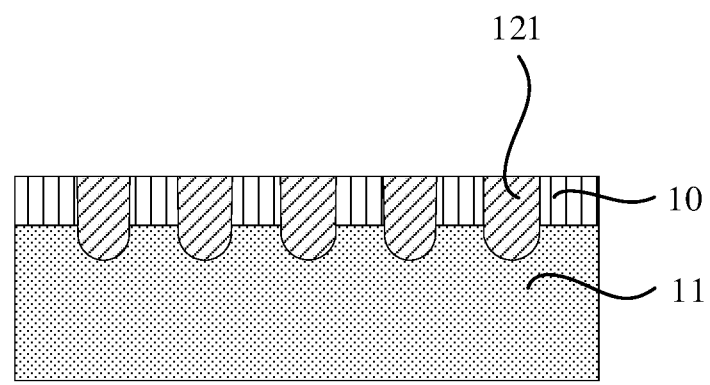
FIG. 8D is a cross-sectional view along the D-D' line of a structure obtained at S14 provided by an embodiment.
Figure 9A:
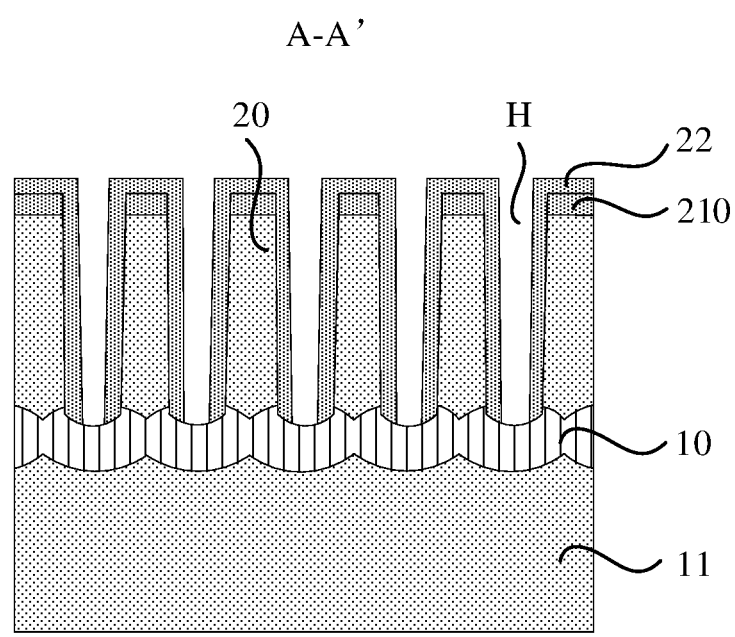
FIG. 9A is a cross-sectional view along the A-A' line of a structure obtained at S15 provided by an embodiment.
Figure 9B:
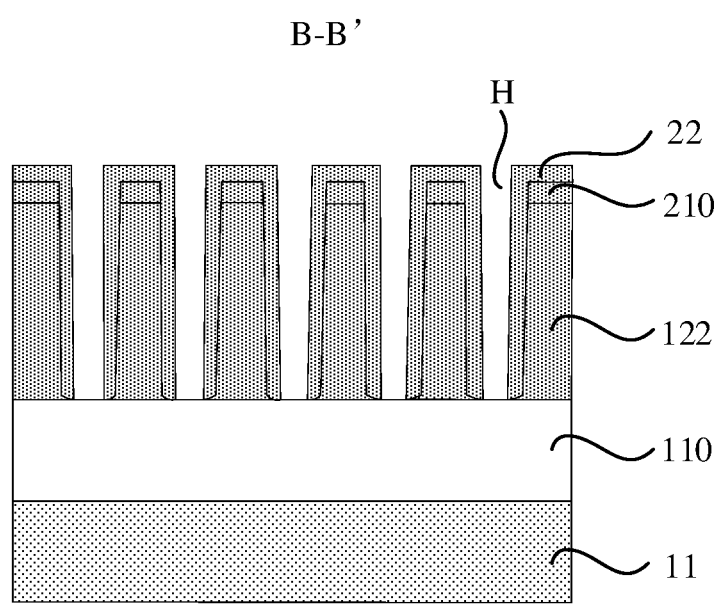
FIG. 9B is a cross-sectional view along the B-B' line of a structure obtained at S15 provided by an embodiment.
Figure 9C:
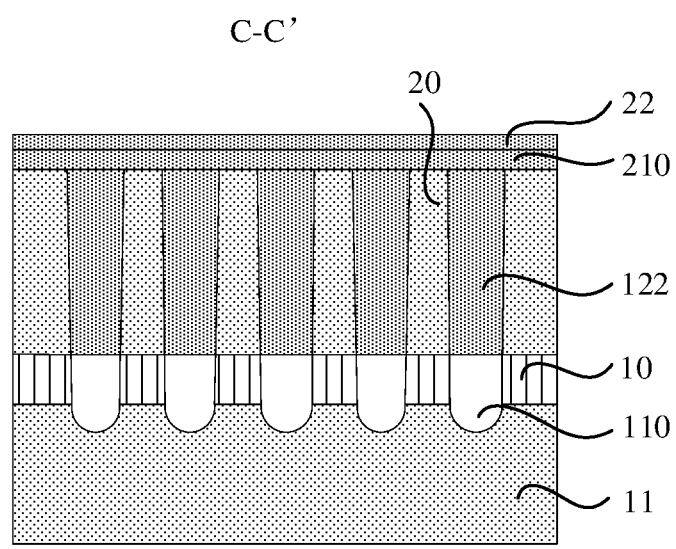
FIG. 9C is a cross-sectional view along the C-C' line of a structure obtained at S15 provided by an embodiment.
Figure 9D:
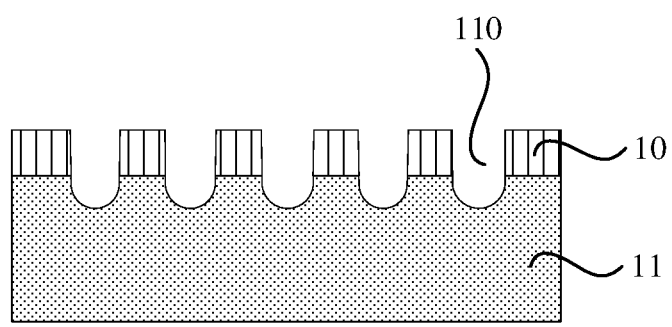
FIG. 9D is a cross-sectional view along the D-D' line of a structure obtained at S15 provided by an embodiment.
Figure 10A:
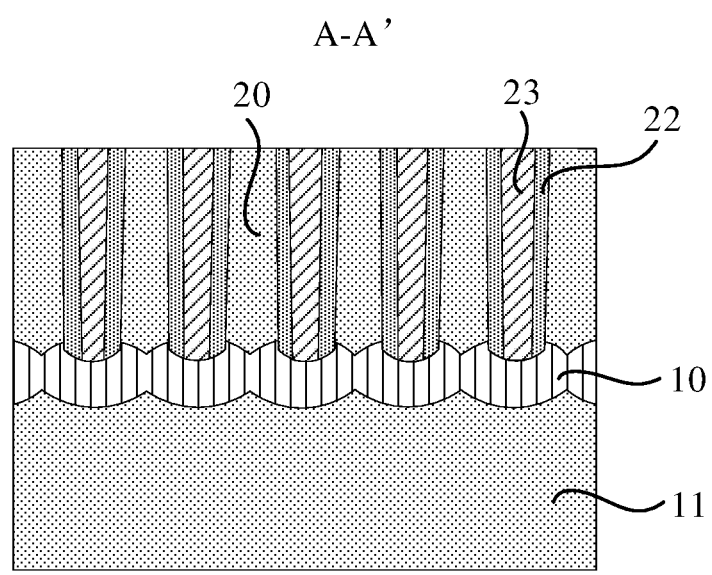
FIG. 10A is a cross-sectional view along the A-A' line of a structure obtained at S16 provided by an embodiment.
Figure 10B:
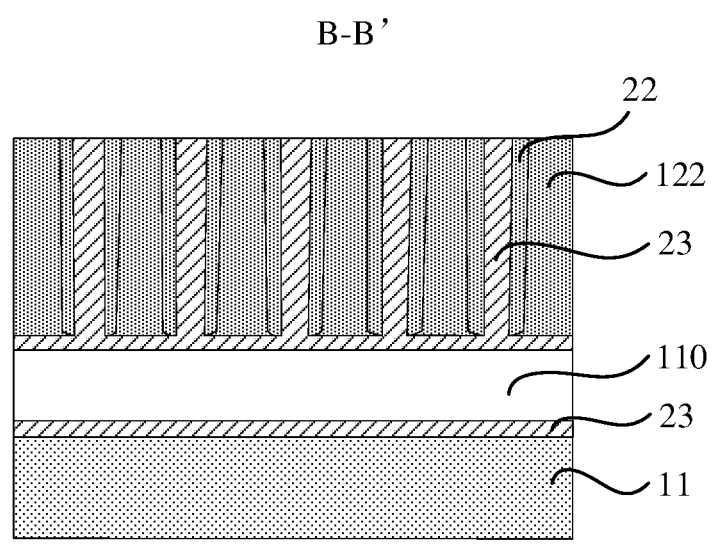
FIG. 10B is a cross-sectional view along the B-B' line of a structure obtained at S16 provided by an embodiment.
Figure 10C:
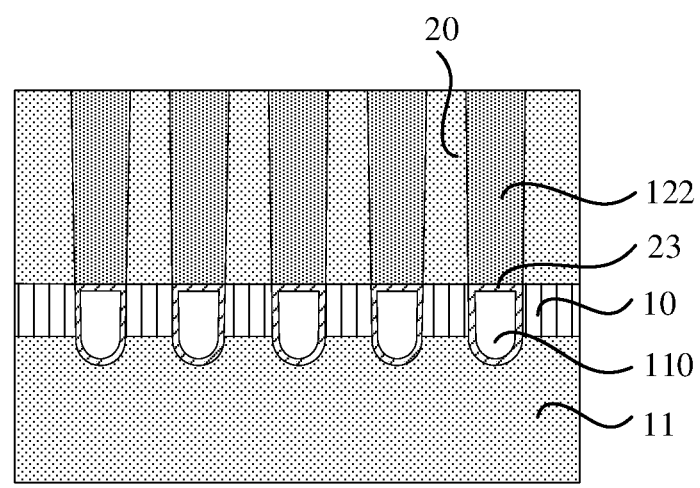
FIG. 10C is a cross-sectional view along the C-C' line of a structure obtained at S16 provided by an embodiment.
Figure 10D:
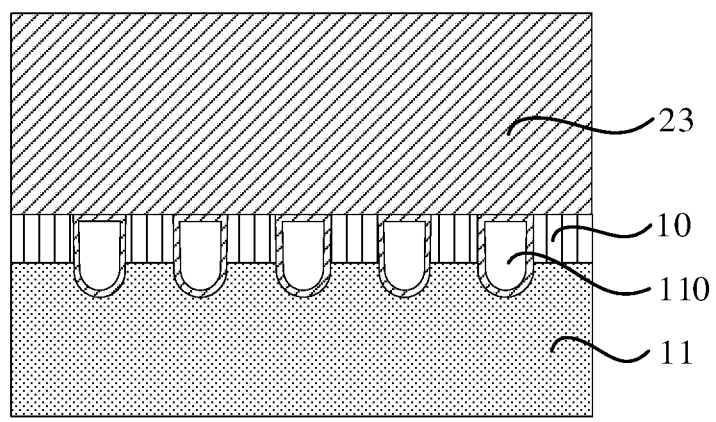
FIG. 10D is a cross-sectional view along the D-D' line of a structure obtained at S16 provided by an embodiment.
Figure 11A:
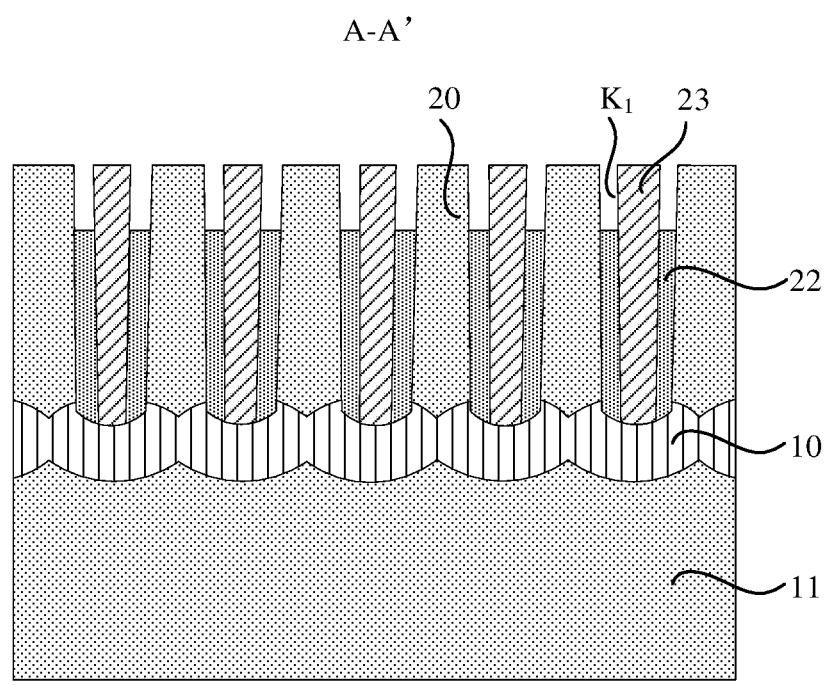
FIG. 11A is a cross-sectional view along the A-A' line of a structure obtained at S17 provided by an embodiment.
Figure 11B:
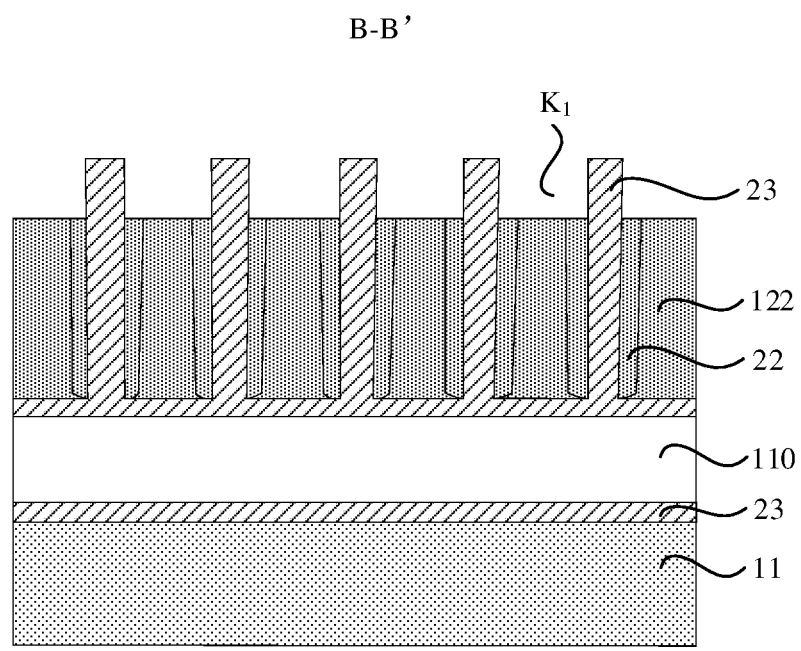
FIG. 11B is a cross-sectional view along the B-B' line of a structure obtained at S17 provided by an embodiment.
Figure 11C:
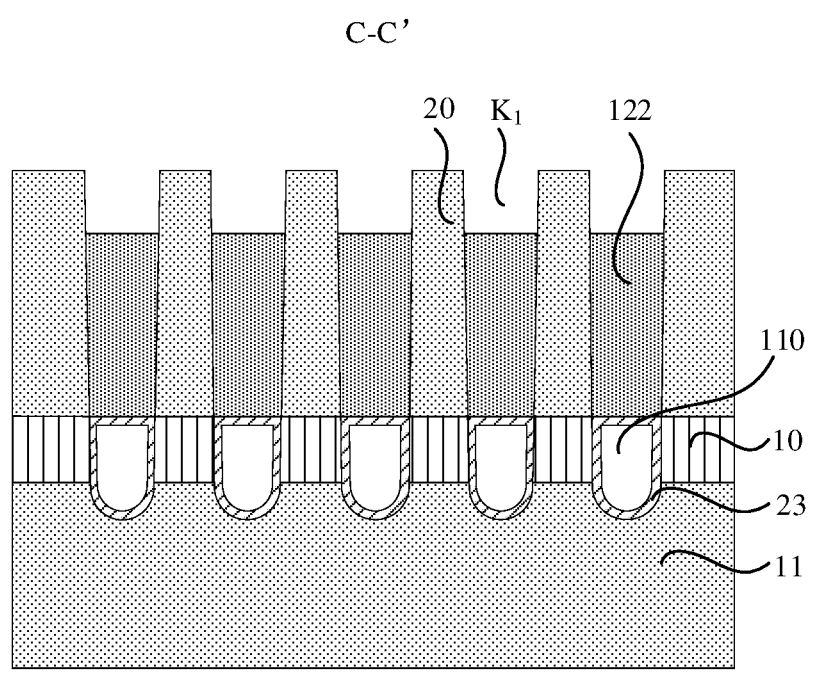
FIG. 11C is a cross-sectional view along the C-C' line of a structure obtained at S17 provided by an embodiment.
Figure 11D:
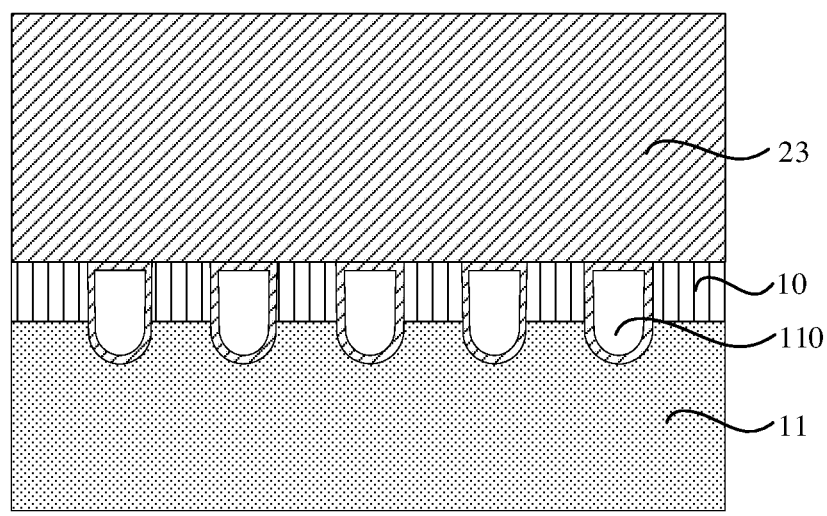
FIG. 11D is a cross-sectional view along the D-D' line of a structure obtained at S17 provided by an embodiment.
Figure 12A:
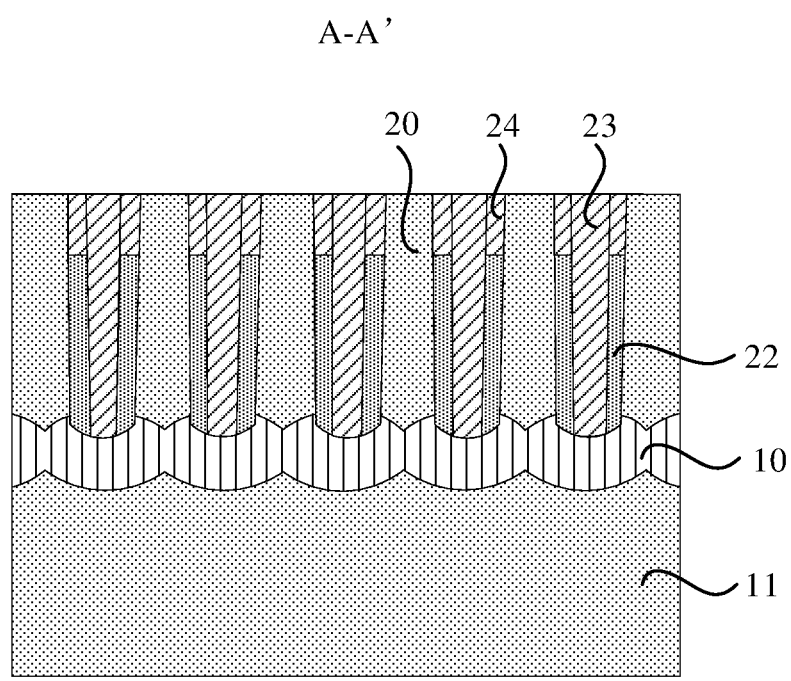
FIG. 12A is a cross-sectional view along the A-A' line of a structure obtained at S18 provided by an embodiment.
Figure 12B:
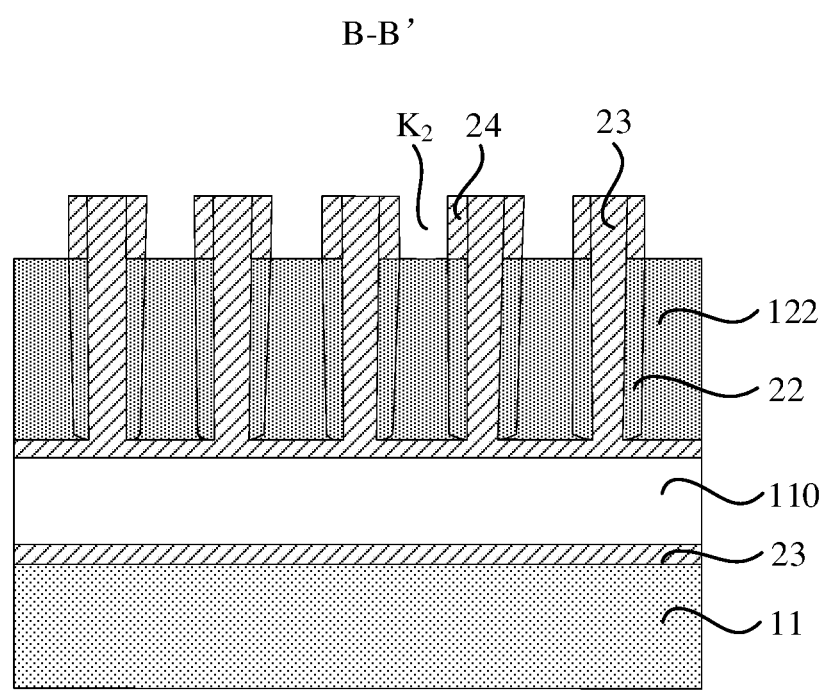
FIG. 12B is a cross-sectional view along the B-B' line of a structure obtained at S18 provided by an embodiment.
Figure 12C:
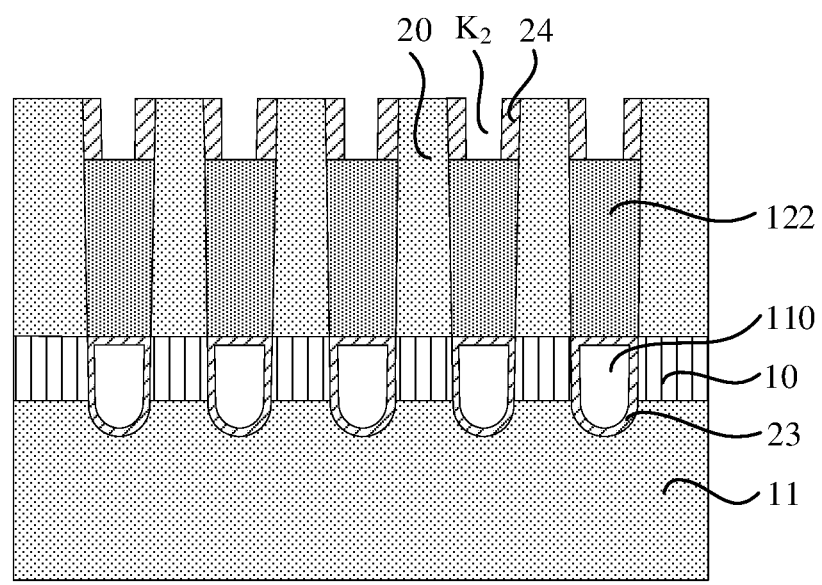
FIG. 12C is a cross-sectional view along the C-C' line of a structure obtained at S18 provided by an embodiment.
Figure 12D:
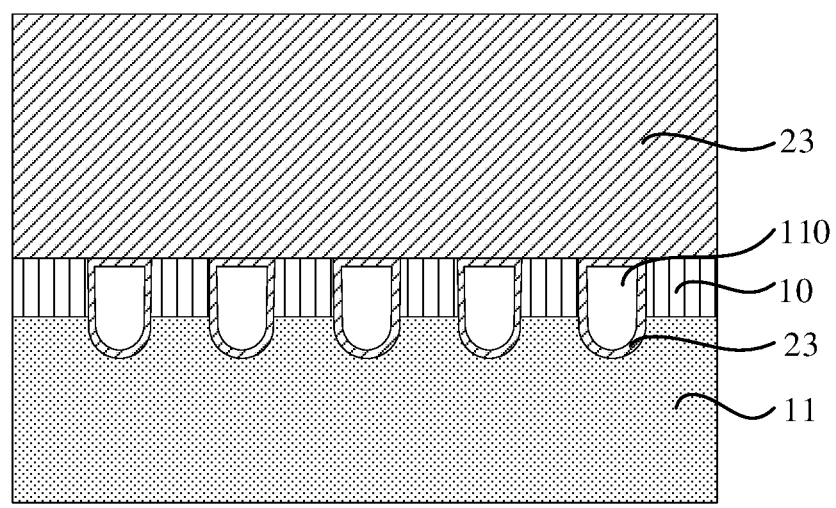
FIG. 12D is a cross-sectional view along the D-D' line of a structure obtained at S18 provided by an embodiment.

Based on this, please refer to FIG. 3, some embodiments of the present disclosure provide a method for manufacturing a semiconductor structure, which includes S11, S12, S13, S14 and S15.

At S11, a substrate is provided, and first shallow trench isolation structures are formed in the substrate. A first shallow trench isolation structure includes a sacrificial layer and a first dielectric layer which are stacked from bottom up in sequence. The first shallow trench isolation structures isolate a plurality of active areas in the substrate. The active areas extend in a first direction.

At S12, a plurality of word line isolation grooves are formed in the substrate. A word line isolation groove is located on the sacrificial layer and extends in a second direction, which intersects with the first direction.

At S13, a second dielectric layer is formed on the sidewalls of the word line isolation groove. A pore penetrating to the substrate is provided inside the second dielectric layer.

At S14, a lower part of an active area is metallized based on the pore to form a bit line which extends in the first direction.

S15, the sacrificial layer is removed based on the pore to form an air gap between adjacent bit lines.

In this embodiment, an air gap is formed between adjacent bit lines. The mutual coupling between bit lines or between a bit line and a gate word line can be effectively eliminated by the air gap, thereby reducing a parasitic capacitance between the lines so as to improve the electrical property of semiconductor structures.

Please refer to S11 of FIG. 3, FIGS. 2, 4A to 4D and 5A to 5D. S11 includes providing the substrate 11 and forming the first shallow trench isolation structures 12 in the substrate 11. The first shallow trench isolation structures 12 isolate the plurality of active areas in the substrate 11. The active areas extend in the first direction, which is for example the column direction. The first shallow trench isolation structure 12 includes the sacrificial layer 121 and the first dielectric layer 122 stacked from bottom up in sequence.

Optionally, forming the first shallow trench isolation structures 12 in the substrate 11 includes: forming the first shallow trenches 120 in the substrate 11, as shown in FIGS. 4A to 4D; and depositing the sacrificial layer 121 and the first dielectric layer 122 in sequence in a first shallow trench 120, as shown in FIGS. 5A to 5D.

In one example, the substrate 11 includes, but is not limited to, a silicon substrate or a silicon-based substrate.

In one example, the sacrificial layer 121 includes, but is not limited to, a nitride layer, such as a silicon nitride layer.

In one example, the first dielectric layer 122 includes, but is not limited to, an oxide layer, such as a silicon oxide layer.

Optionally, referring to FIGS. 4A to 4D, forming the first shallow trenches 120 in the substrate 11 may be realized by a self-aligned double patterning (SADP) process or a self-aligned quadruple patterning (SAQP) process.

Optionally, referring to FIGS. 5A to 5D, after the sacrificial layer 121 and the first dielectric layer 122 are deposited in sequence in the first shallow trench 120, a chemical mechanical polishing (CMP) process may be performed on the obtained structure to ensure the surface planarization of the obtained structure. The deposition process includes, but is not limited to, a physical vapor deposition (PVD) process, a chemical vapor deposition (CVD) process or an atomic layer deposition (ALD) process.

Please refer to S12 of FIG. 3, and FIGS. 2 and 6A to 6D. S12 includes forming the plurality of word line isolation grooves 21 in the substrate 11. A word line isolation groove 21 is located above the sacrificial layer 121 and extends in the second direction, which intersects with the first direction.

Optionally, the second direction is perpendicular to the first direction. The second direction is for example the row direction.

Optionally, forming the plurality of word line isolation grooves 21 in the substrate 11 may be realized by the self-aligned double patterning (SADP) process or the self-aligned quadruple patterning (SAQP) process.

It can be understood that after the word line isolation grooves 21 are formed, part of material of the substrate 11 located in the active areas is removed, and a plurality of columnar structures 20 can be obtained.

In one embodiment, referring to FIGS. 6A-6D, the method for manufacturing a semiconductor structure further includes performing ion implantation on a lower part and an upper part of a columnar structure 20, respectively, to form a source, a drain and a conductive channel between the source and the drain. The source is located in the lower part of the columnar structure 20 and the drain is located in the upper part of the columnar structure 20. The types of ions implanted to form the source and drain are different, and this embodiment is not particularly limited to this. In addition, depths for implanting ions required to form the source and drain may be selected and set according to actual requirements.

Optionally, referring to FIGS. 6A to 6D, the method for manufacturing a semiconductor structure further includes: before performing the ion implantation on the columnar structure 20, depositing a barrier layer 210 on the upper surface of the substrate 11 with the word line isolation grooves 21 formed. In this way, the upper surface of the substrate 11 can be protected with the barrier layer 210 to prevent the upper surface of the substrate 11 from being affected by the ion implantation.

Please refer to S13 of FIG. 3, and FIGS. 2 and 7A to 7D. S13 includes forming a second dielectric layer 22 on the sidewalls of a word line isolation groove 21. A pore H penetrating to the substrate is provided inside the second dielectric layer.

In one embodiment, the second dielectric layer 22 includes, but is not limited to, an oxide layer, such as a silicon oxide layer. The second dielectric layer 22 may be formed by a deposition process, such as the atomic layer deposition process.

Here, the pore H inside the second dielectric layer 22 is configured to expose part of the surface of the substrate 11, and the size of the pore H can be selected and set according to process requirements. After the second dielectric layer 22 is formed by depositing, if the size of the pore H is smaller than the expected size, the expected size can be achieved by removing part of the second dielectric layer 22 by etching.

Please refer to S14 of FIG. 3, and FIGS. 2 and 8A to 8D. S14 includes metallizing a lower part of an active area based on the pore H to form a bit line 10, which extends in the first direction.

In one embodiment, metallizing the lower part of the active area based on the pore H to form the bit line 10 includes implanting metal ions into the pore H to metallize the lower part of the active area to form the bit line 10.

Here, the bit lines 10 are prepared as described above, and the lower surfaces of the bit lines 10 are wavy in their extension direction.

Optionally, the metal ions include, but are not limited to, cobalt (Co) ions. When the substrate 11 is a silicon substrate or a silicon-based substrate, the material of the bit lines 10 after the active areas are metallized by cobalt ions is cobalt silicide. In this way, the bit lines 10 are made of a metal silicide, such as cobalt silicide, and can have a low resistance, which is beneficial to improve the electrical property of semiconductor structures.

In addition, the second dielectric layer 22 formed on the sidewalls of the word line isolation groove 21 at S13 can effectively protect the portion of the substrate 11 located in the corresponding area from being metallized by the metal ions during the execution of S14.

Please refer to S15 of FIG. 3, and FIGS. 2 and 9A to 9D. S15 includes removing the sacrificial layer 121 based on the pores H to form air gaps 110 between adjacent bit lines 10.

In one embodiment, the sacrificial layer 121 is a silicon nitride layer, for example. The sacrificial layer 121 may be removed by wet etching, such as etching with a phosphoric acid etching solution. Specifically, the phosphoric acid etching solution enters in the D-D' direction of FIG. 9, and then flows in the B-B' direction to etch and remove the sacrificial layer 121.

Please refer to FIG. 3 again. In some embodiments, the method for manufacturing a semiconductor structure further includes S16, S17, S18, S19, S20 and S21.

At S16, a third dielectric layer is formed on the sidewalls of the air gap and in the pore.

At S17, part of the first dielectric layer and part of the second dielectric layer are removed to form a plurality of first openings.

At S18, a fourth dielectric layer is formed in a first opening, in which the fourth dielectric layer has a second opening.

At S19, a further part of the first dielectric layer and a further part of the second dielectric layer are continuously removed based on the second opening to form a word line trench.

At S20, a gate dielectric layer is formed on the sidewalls of the word line trench.

At S21, a gate word line is formed in the word line trench.

In this embodiment, the third dielectric layer may be used for effectively sealing the air gap between adjacent bit lines to better insulate a bit line from another bit line or a bit line from a gate word line, thereby further reducing the parasitic capacitance between the lines so as to improve the electrical property of semiconductor structures.

Please refer to S16 of FIG. 3, and FIGS. 2 and 10A to 10D. S16 includes forming the third dielectric layer 23 on the sidewalls of the air gap 110 and in the pore H.

Here, the third dielectric layer 23 may be formed by a deposition process, such as the physical vapor deposition process or the atomic layer deposition process.

Optionally, when the aspect ratio of the pore H is high, the third dielectric layer 23 is formed by the physical vapor deposition process.

Optionally, when the aspect ratio of the pore H is low, the third dielectric layer 23 is formed by the atomic layer deposition process.

Please refer to S17 of FIG. 3 and FIGS. 2 and 11A to 11D. S17 includes removing part of the first dielectric layer 122 and part of the second dielectric layer 22 to form a plurality of first openings $K_1$.

In one embodiment, the materials of the first dielectric layer 122 and the second dielectric layer 22 are the same, for example, both are a silicon oxide layer. The parts to be removed of the first dielectric layer 122 and the second dielectric layer 22 may be etched and removed by a same etching process.

Here, the shape and size of the first opening $K_1$ may be selected and set according to actual requirements. According to the foregoing embodiments, the source, the conductive channel and the drain are arranged from bottom up in sequence along a columnar structure 20. The first opening $K_1$ is used for exposing the drain.

Please refer to S18 of FIG. 3 and FIGS. 2 and 12A to 12D. S18 includes forming the fourth dielectric layer 24 in a first opening $K_1$. The fourth dielectric layer 24 is provided with a second opening $K_2$.

Here, the fourth dielectric layer 24 includes, but is not limited to, a nitride layer, such as a silicon nitride layer. The second opening $K_2$ penetrates through the fourth dielectric layer 24 along the thickness direction.

Optionally, a fourth dielectric material layer is formed by a deposition process, and then the second opening $K_2$ is formed by etching and removing, obtaining the fourth dielectric layer 24. The fourth dielectric material layer is formed by, for example, the atomic layer deposition process.

In this embodiment, forming the fourth dielectric layer 24 provided with the second opening $K_2$ in the first opening $K_1$ can help the fourth dielectric layer to effectively support the part of the third dielectric layer 23 located in the pore H, so as to facilitate the subsequent forming process of the word line trench.

Please refer to S19 of FIG. 3, and FIGS. 2 and 13A to 13D. S19 includes continuously removing a further part of the first dielectric layer 122 and a further part of the second dielectric layer 22 based on the second opening $K_2$ to form a word line trench 25.

According to the foregoing embodiments, the source, the conductive channel and the drain are arranged from bottom up in sequence along the columnar structure 20, and the word line trench 25 is used to expose the conductive channel.

Figure 13A:
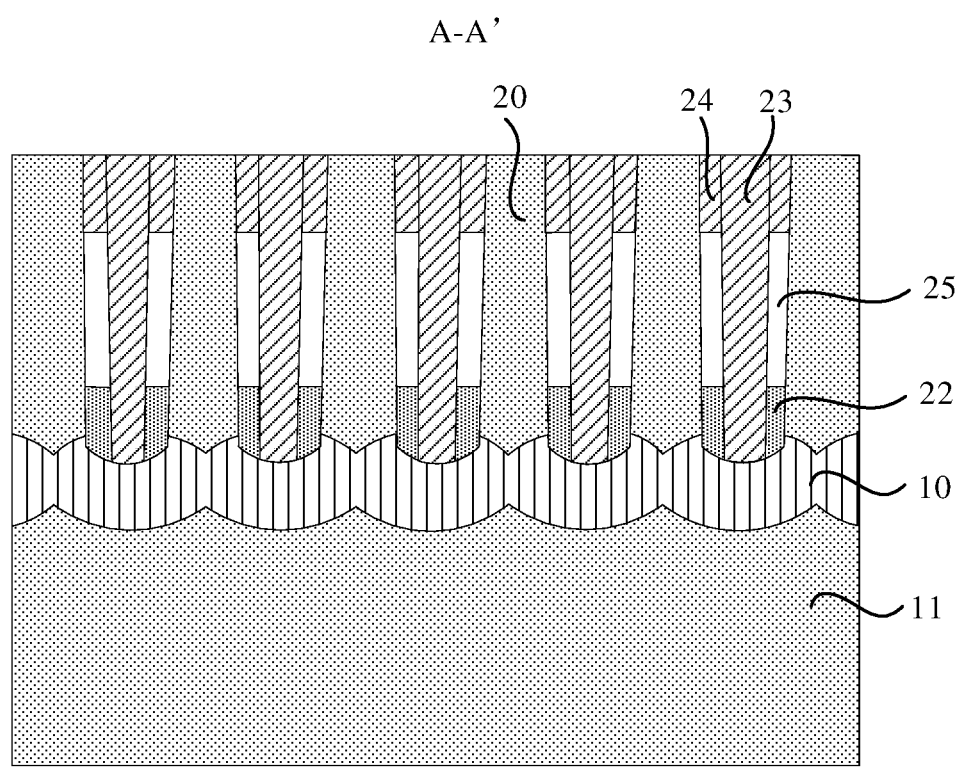
FIG. 13A is a cross-sectional view along the A-A' line of a structure obtained at S19 provided by an embodiment.
Figure 13B:
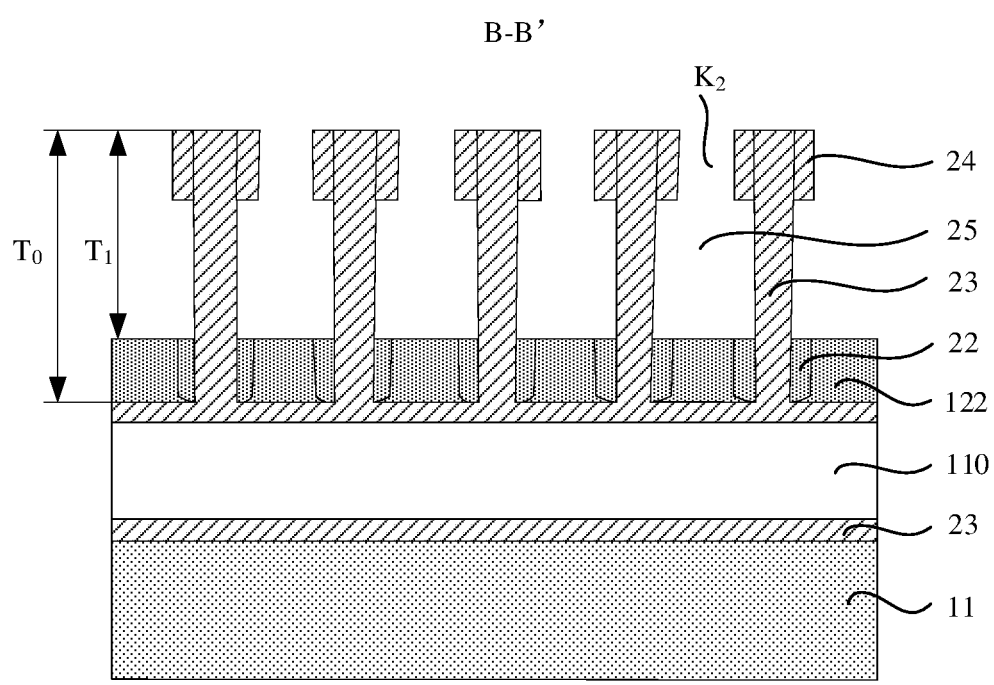
FIG. 13B is a cross-sectional view along the B-B' line of a structure obtained at S19 provided by an embodiment.
Figure 13C:
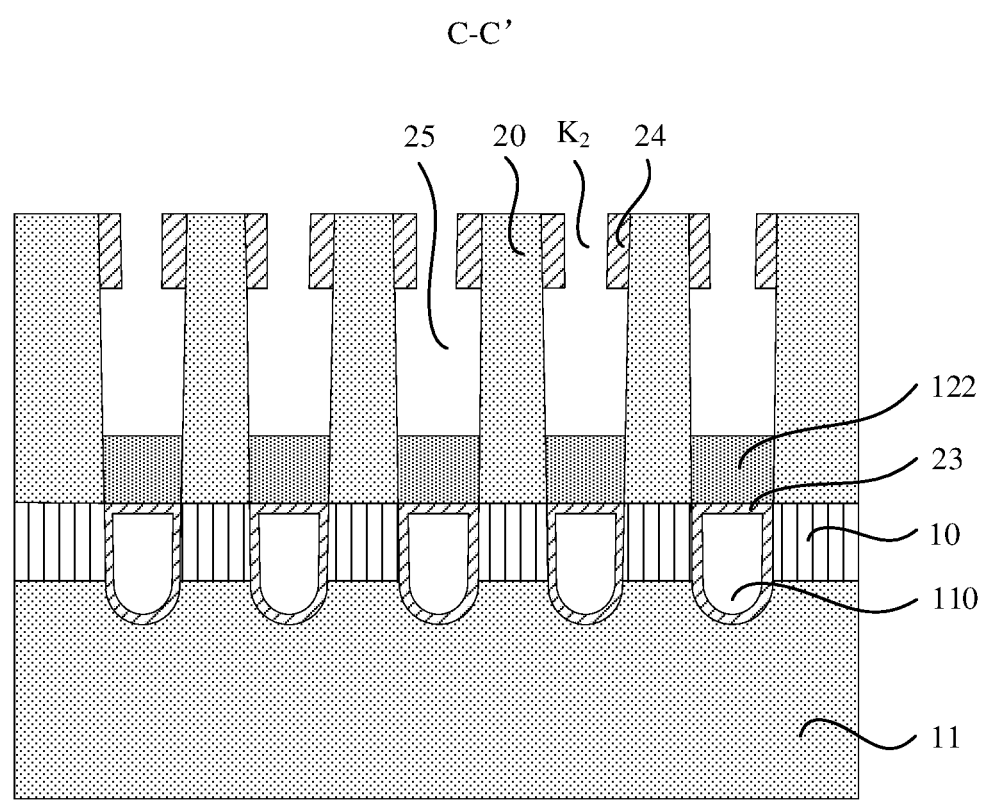
FIG. 13C is a cross-sectional view along the C-C' line of a structure obtained at S19 provided by an embodiment.
Figure 13D:
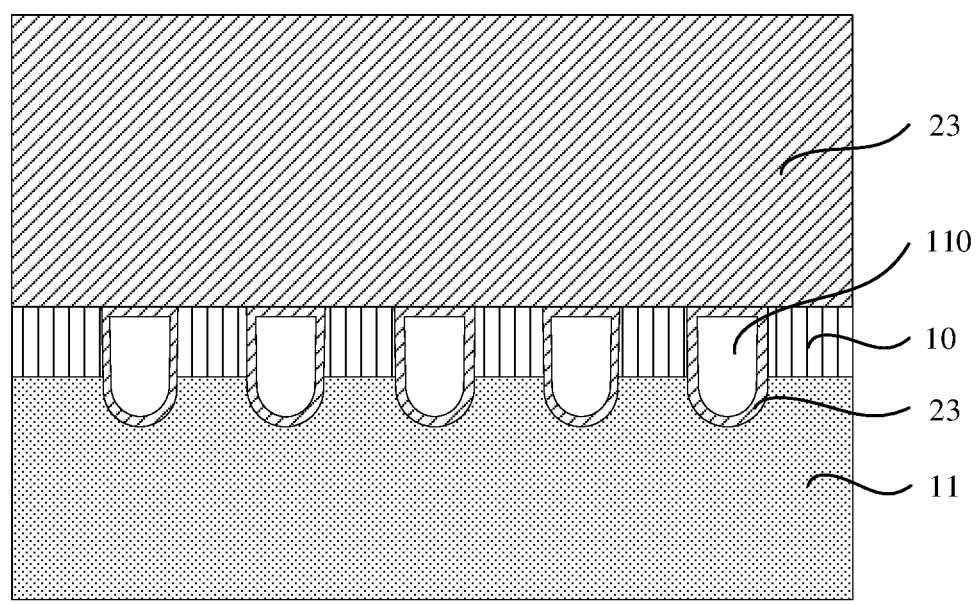
FIG. 13D is a cross-sectional view along the D-D' line of a structure obtained at S19 provided by an embodiment.
Figure 14A:
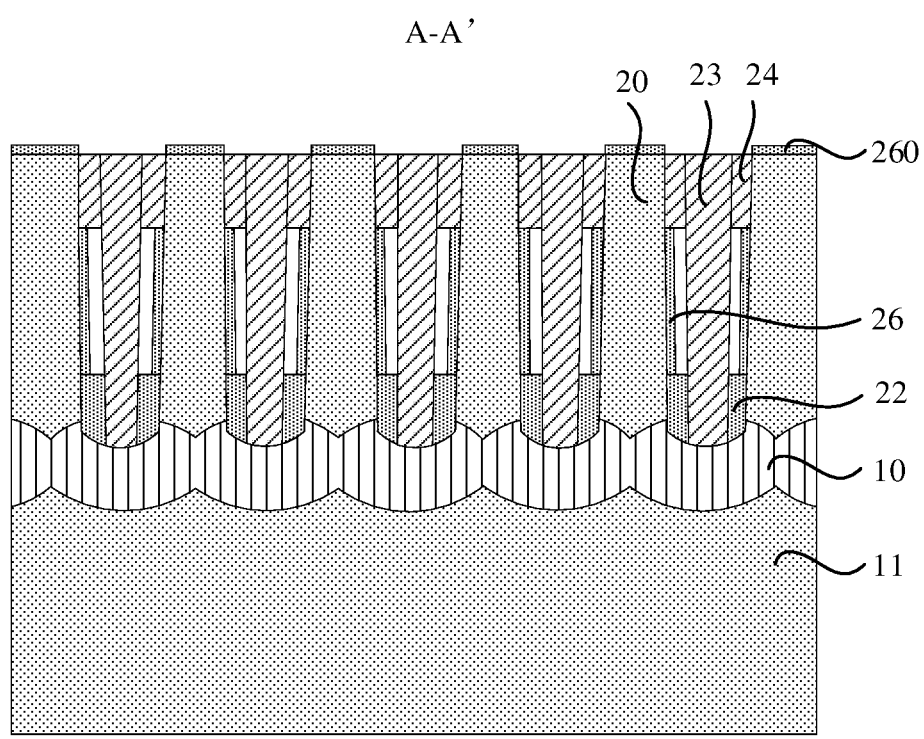
FIG. 14A is a cross-sectional view along the A-A' line of a structure obtained at S20 provided by an embodiment.
Figure 14B:
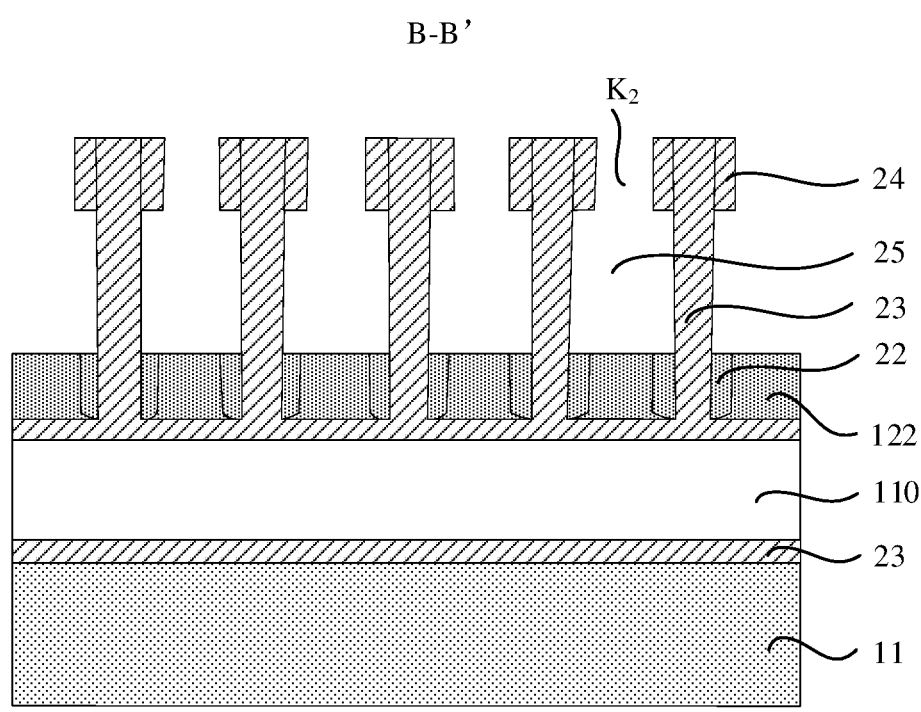
FIG. 14B is a cross-sectional view along the B-B' line of a structure obtained at S20 provided by an embodiment.
Figure 14C:
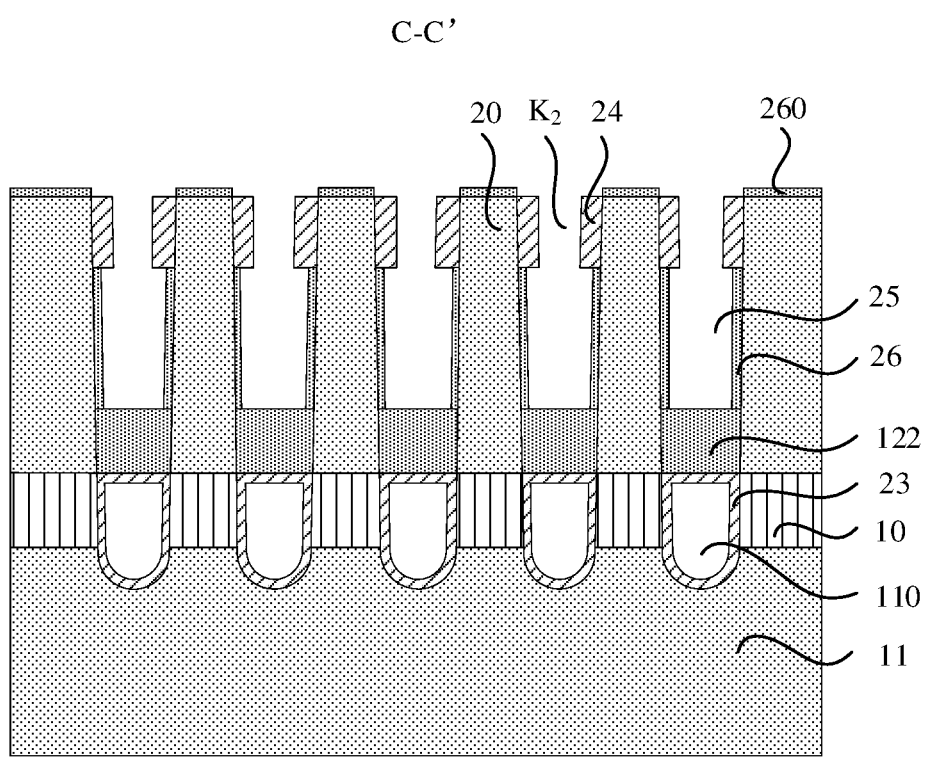
FIG. 14C is a cross-sectional view along the C-C' line of a structure obtained at S20 provided by an embodiment.
Figure 14D:
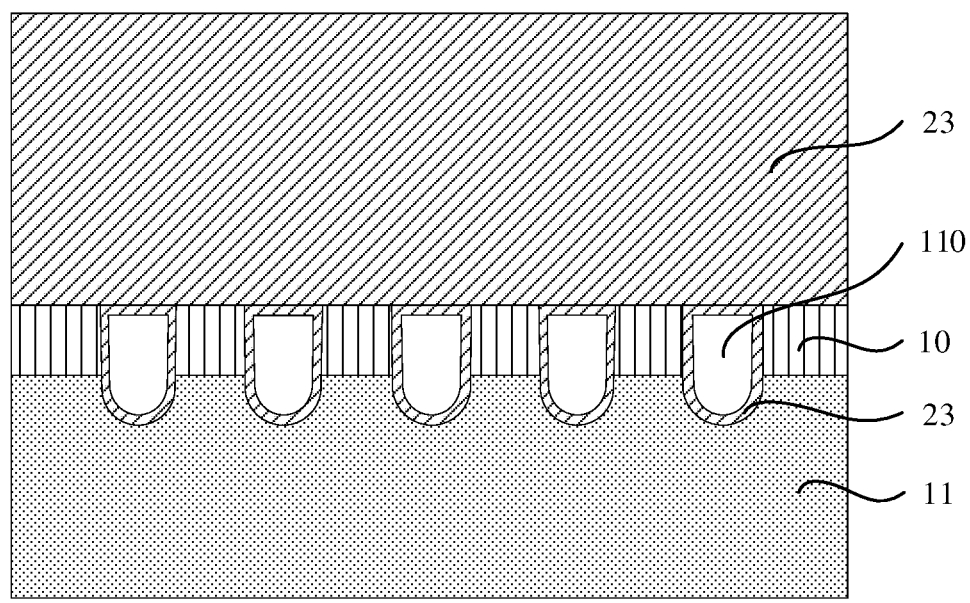
FIG. 14D is a cross-sectional view along the D-D' line of a structure obtained at S20 provided by an embodiment.
Figure 15A:
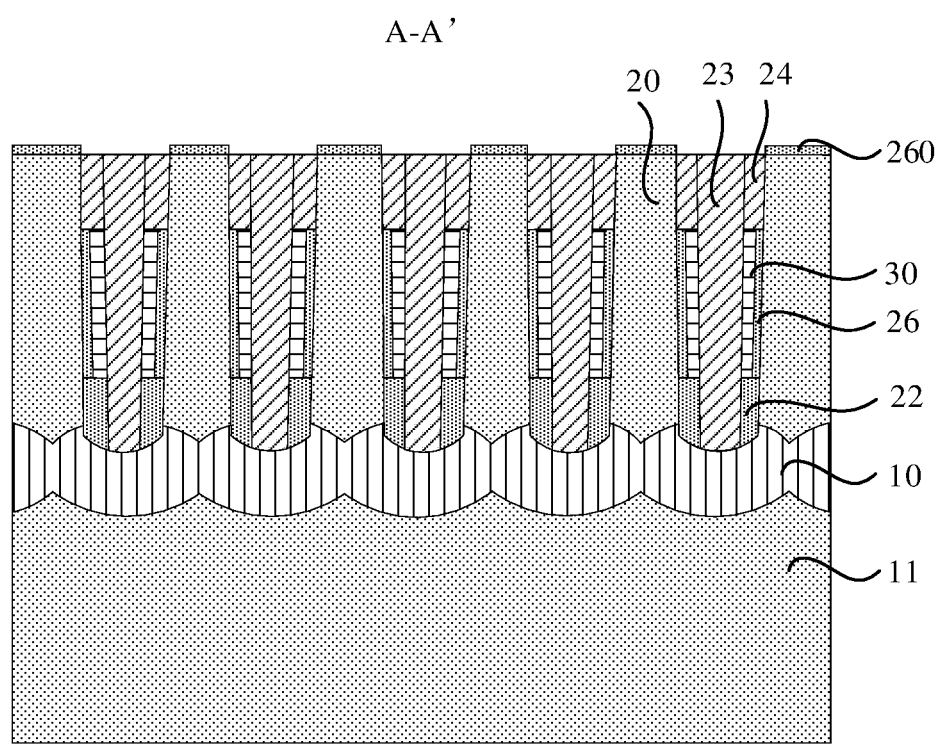
FIG. 15A is a cross-sectional view along the A-A' line of a structure obtained at S21 provided by an embodiment.
Figure 15B:
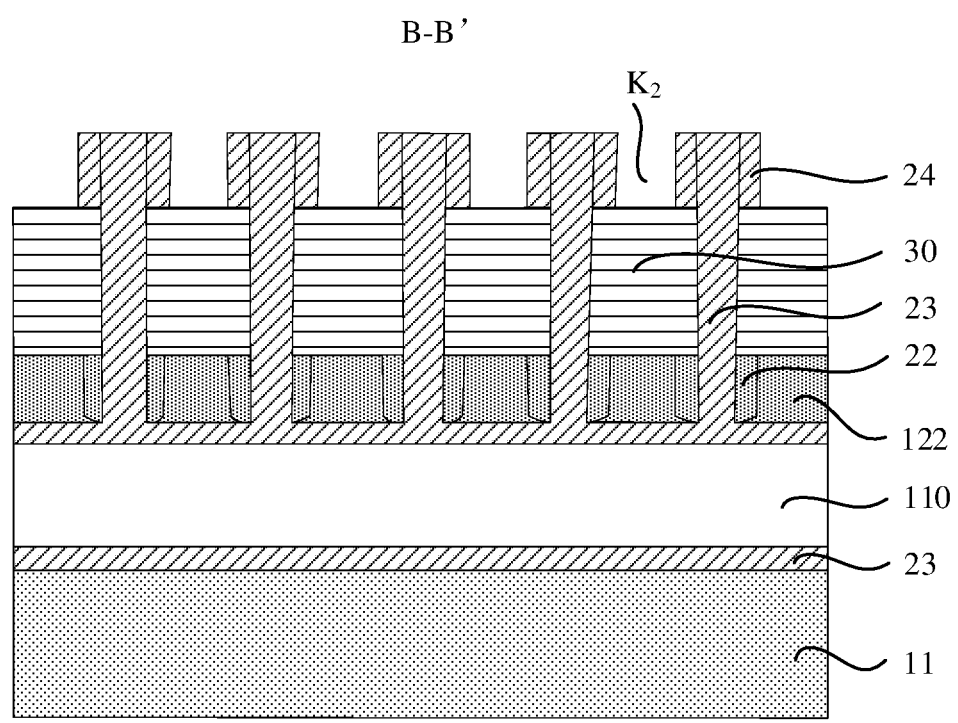
FIG. 15B is a cross-sectional view along the B-B' line of a structure obtained at S21 provided by an embodiment.
Figure 15C:
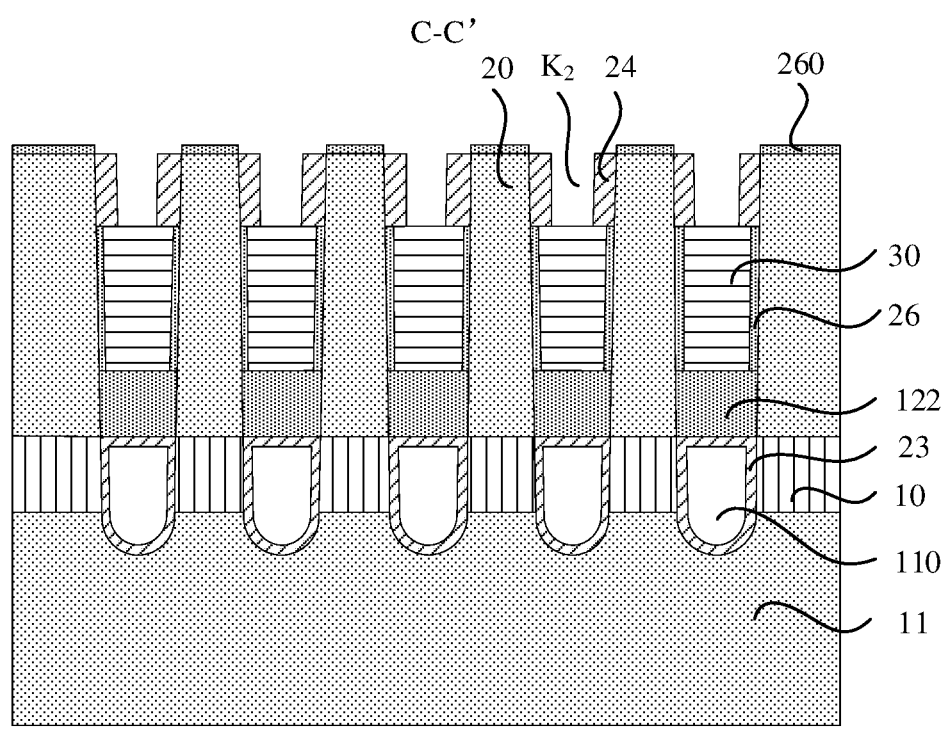
FIG. 15C is a cross-sectional view along the C-C' line of a structure obtained at S21 provided by an embodiment.
Figure 15D:
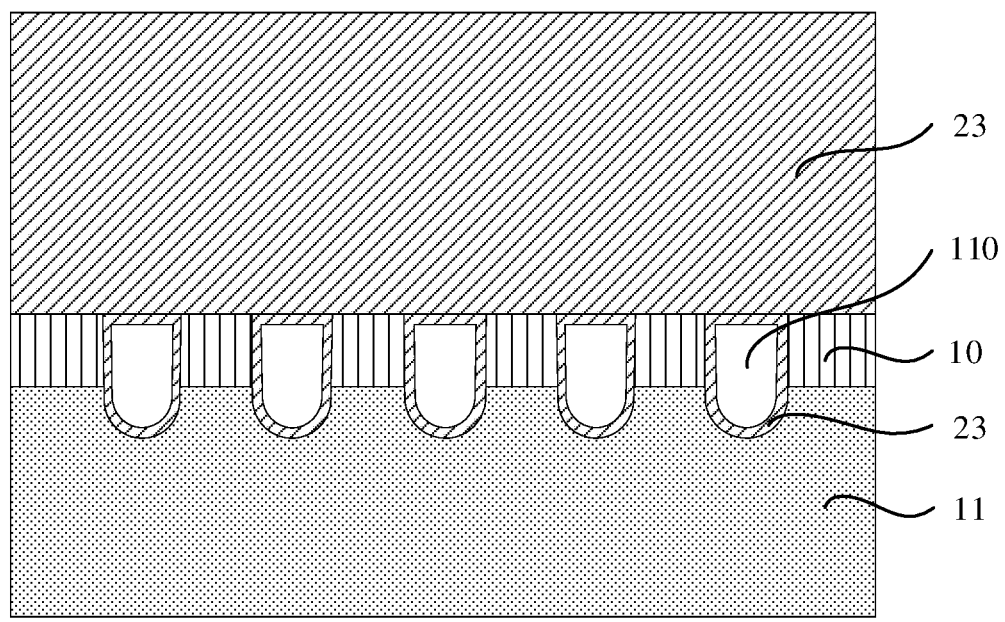
FIG. 15D is a cross-sectional view along the D-D' line of a structure obtained at S21 provided by an embodiment.
Figure 16A:
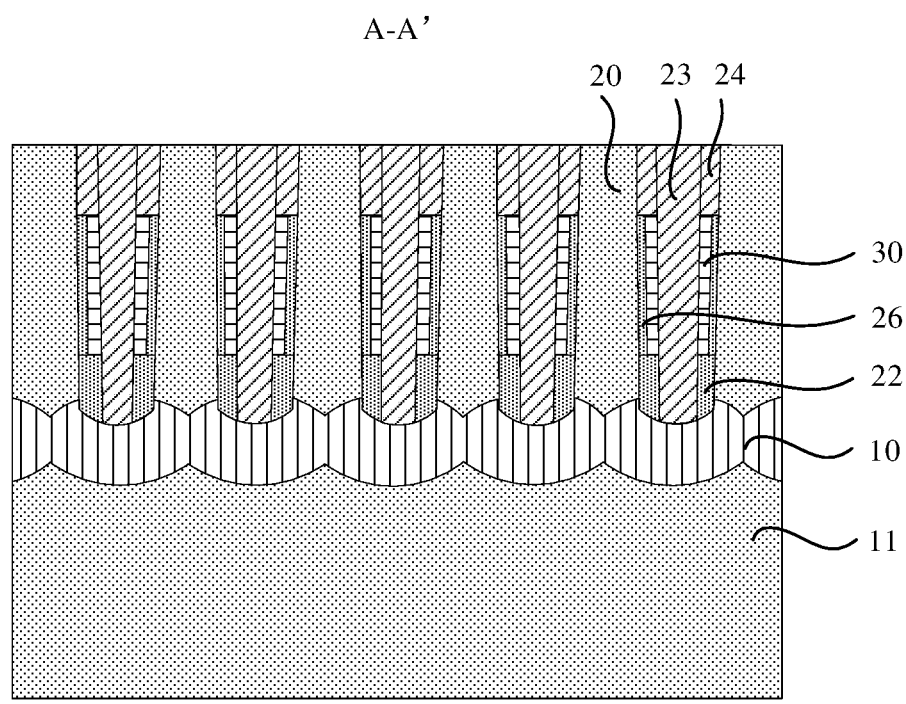
FIG. 16A is a cross-sectional view along the A-A' line of a structure obtained at S22 provided by an embodiment.
Figure 16B:
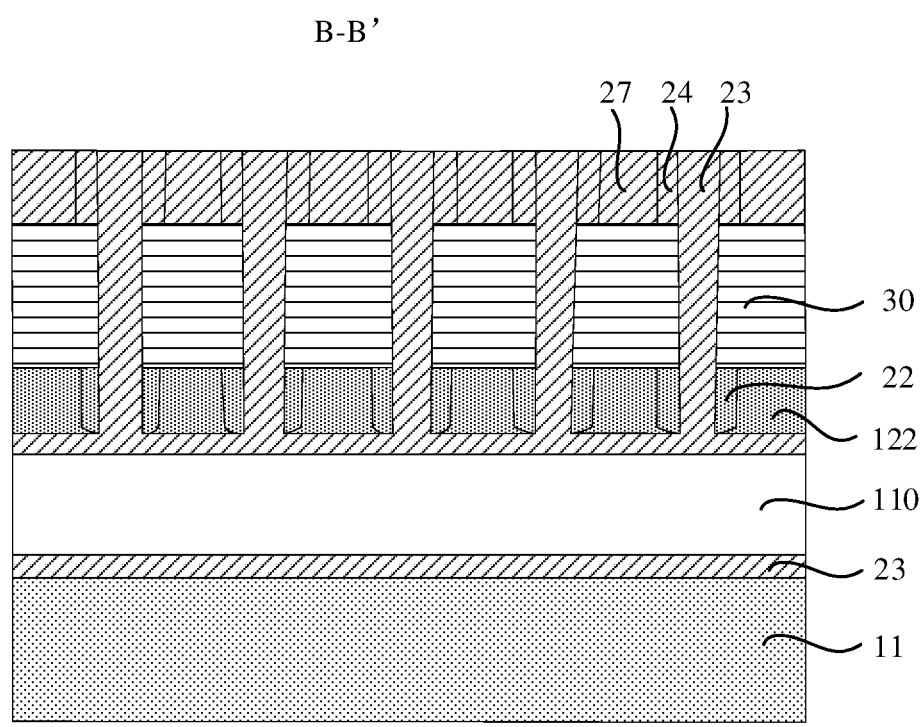
FIG. 16B is a cross-sectional view along the B-B' line of a structure obtained at S22 provided by an embodiment.
Figure 16C:
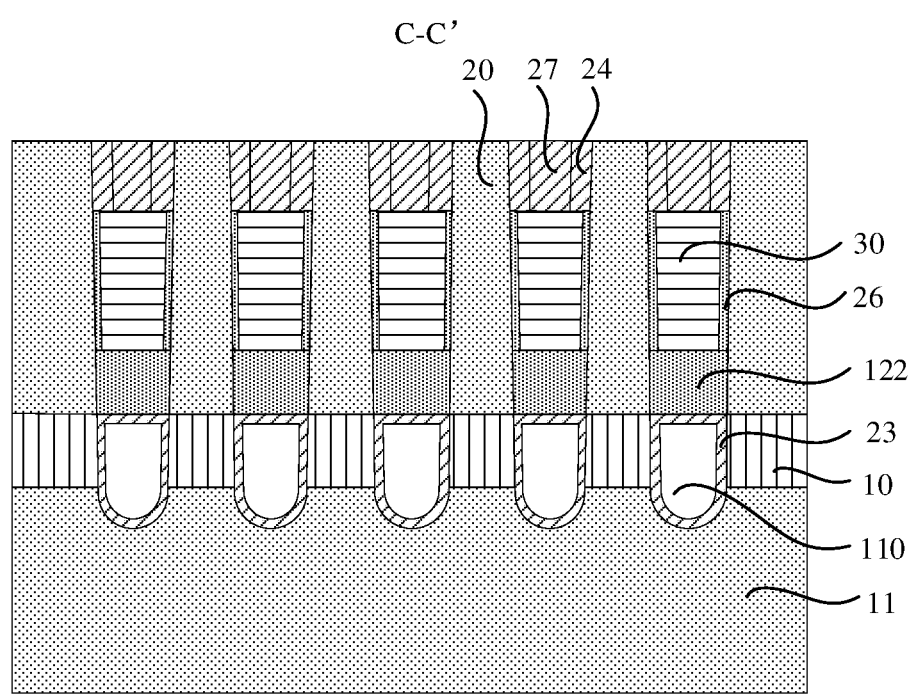
FIG. 16C is a cross-sectional view along the C-C' line of a structure obtained at S22 provided by an embodiment.
Figure 16D:
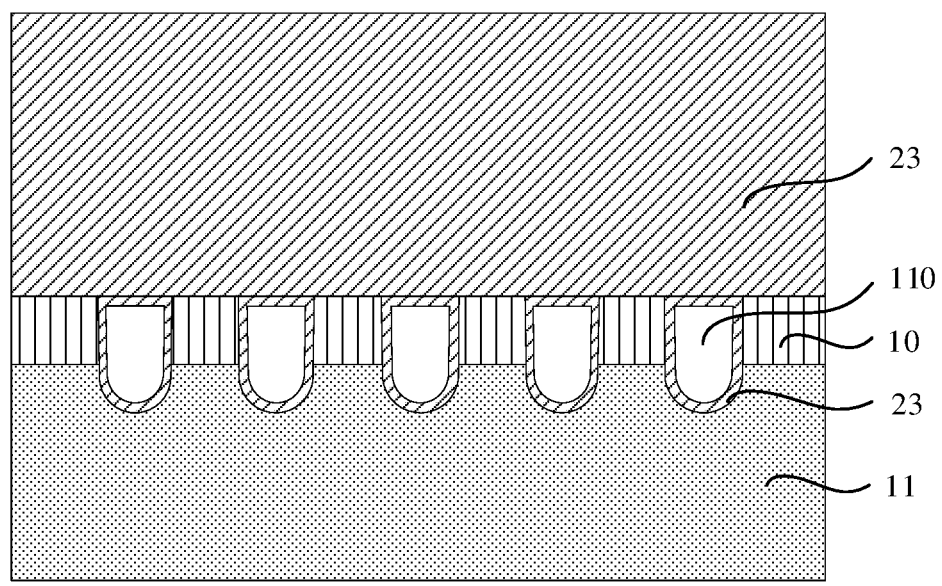
FIG. 16D is a cross-sectional view along the D-D' line of a structure obtained at S22 provided by an embodiment.
Figure 17A:
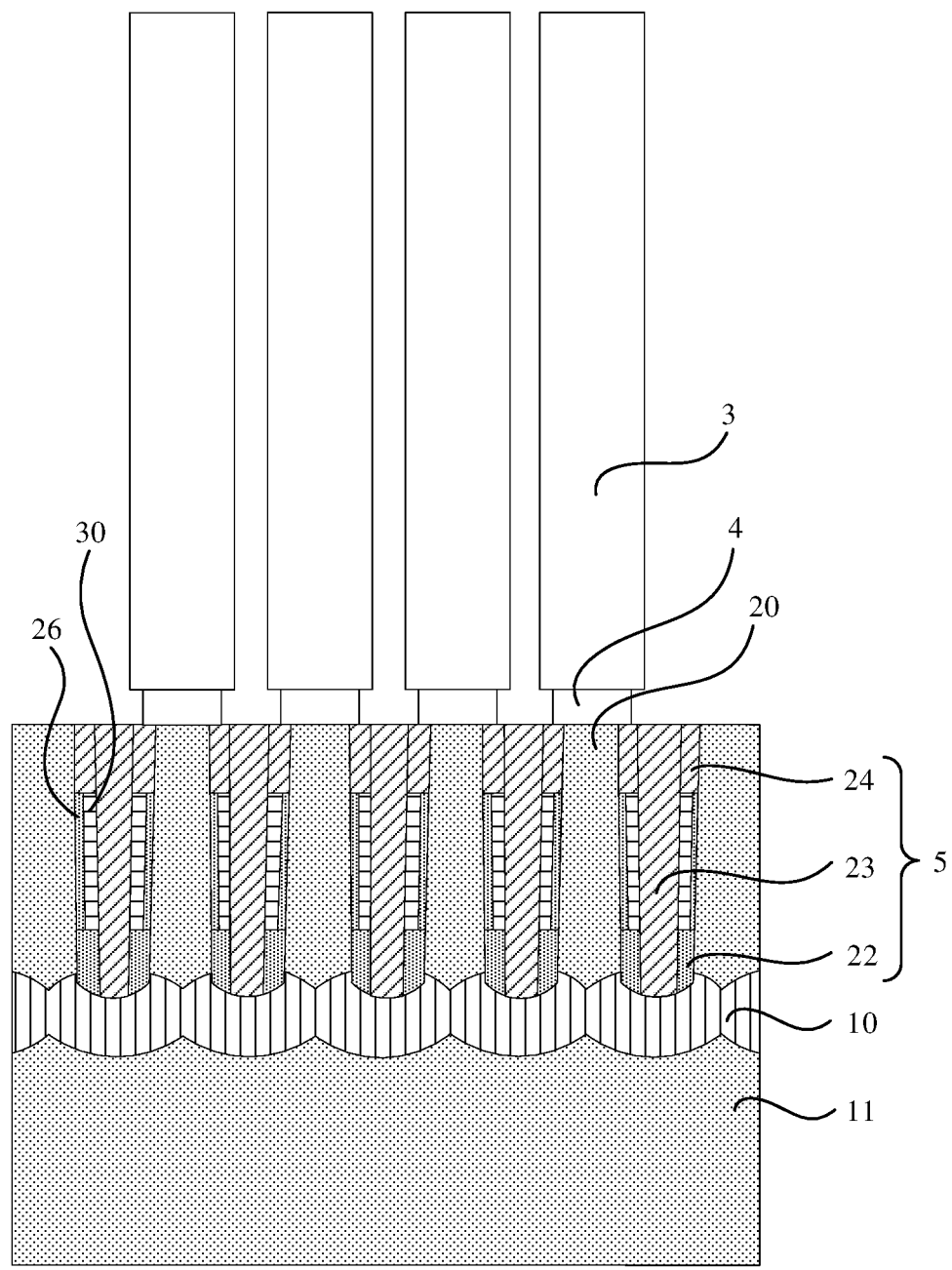
FIG. 17A is a cross-sectional view along the A-A' line of a structure obtained at S23 and S24 provided by an embodiment.
Figure 17B:
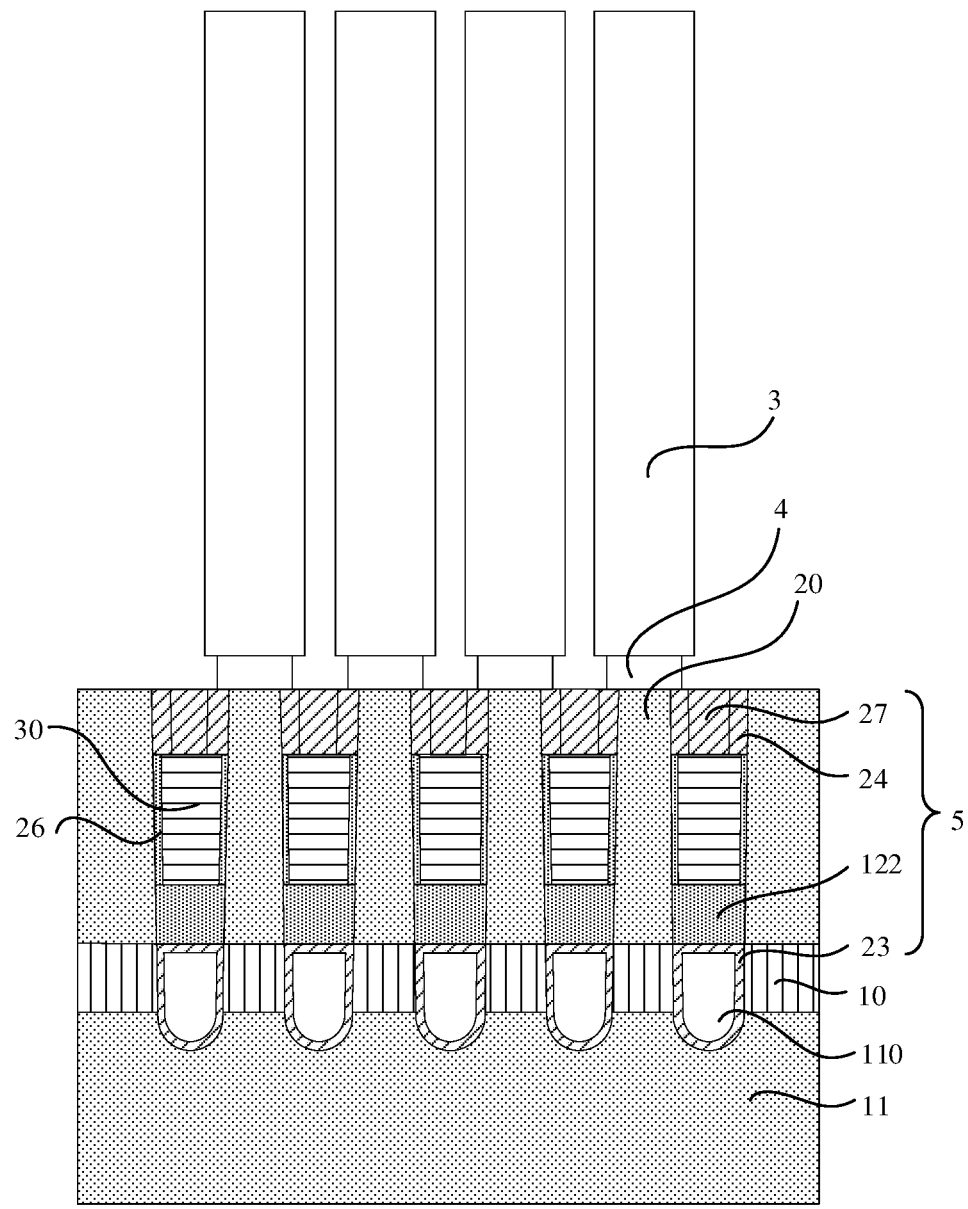
FIG. 17B is a cross-sectional view along the C-C' line of a structure obtained at S23 and S24 provided by an embodiment.

In one embodiment, referring to FIG. 13B, the total thickness $T_1$ of the removed first dielectric layer 122 is one-third to two-thirds of the initial thickness $T_0$ of the first dielectric layer 122. Optionally, $T_1$ is one third, two fifths, one half, three fifths or two thirds of $T_0$.

Please refer to S20 of FIG. 3, and FIGS. 2 and 14A to 14D. S20 includes forming a gate dielectric layer 26 on the sidewalls of the word line trench 25.

In one embodiment, forming the gate dielectric layer 26 on the sidewalls of the word line trench 25 includes forming the gate dielectric layer 26 on the sidewalls of the word line trench 25 by a thermal oxidation process. The gate dielectric layer 26 is a silicon oxide layer, for example.

Optionally, refer to FIGS. 14A to 14D, the obtained structure after the word line trench 25 is formed is placed in an oxidizing environment. For example, a gas flow of an oxidant is introduced into the obtained structure after the word line trench 25 is formed, and the obtained structure is placed in a high-temperature environment, so that the material of the sidewalls of the word line trench 25 is converted from silicon to silicon oxide. The temperature of the high-temperature environment may be selected and set according to actual requirements, and this embodiment is not limited to this. Here, the upper surface of the substrate 11 is also easily oxidized to form an oxide layer 260.

Please refer to S21 of FIG. 3 and FIGS. 2 and 15A to 15D. S21 includes forming a gate word line 30 in the word line trench 25.

In one embodiment, forming the gate word line 30 in the word line trench 25 includes filling a titanium nitride material in the word line trench 25 to form the gate word line 30.

Here, the titanium nitride material may be filled by the atomic layer deposition process. In addition, after the filling process is completed, excess filling material may be removed by a wet etching process.

According to the foregoing embodiments, the source, the conductive channel and the drain are arranged from bottom up in sequence along the columnar structure 20. After the gate word line 30 is formed, the gate word line 30 surrounds the periphery of the conductive channel, and the aforementioned gate dielectric layer 26 is formed between the gate word line 30 and the conductive channel.

Please refer to FIG. 3 again. In some embodiments, the method for manufacturing a semiconductor structure further includes S22, S23 and S24.

At S22, a fifth dielectric layer is filled in the second opening, in which an upper surface of the fifth dielectric layer is flush with an upper surface of the fourth dielectric layer.

At S23, a storage node contact structure is formed on a top surface of the columnar structure.

At S24, a storage capacitor is formed on the storage node contact structure.

Please refer to S22 of FIG. 3, and FIGS. 2 and 16A to 6D. S22 includes filling the fifth dielectric layer 27 in the second opening $K_2$. The upper surface of the fifth dielectric layer 27 is flush with the upper surface of the fourth dielectric layer 24.

In one embodiment, the material of the fifth dielectric layer 27 is the same as that of the fourth dielectric layer 24, such as silicon nitride.

Optionally, filling the fifth dielectric layer 27 in the second opening $K_2$ includes depositing a fifth dielectric material layer in the second opening $K_2$ and performing a chemical mechanical polishing on the deposited structure, to ensure that the upper surface of the fifth dielectric layer 27 is flush with the upper surface of the fourth dielectric layer 24. In this way, the upper surface of the obtained structure with the fifth dielectric layer 27 formed has a better surface quality, which is convenient for the subsequent preparation of the storage node contact structure 4 and ensures a good contact between the storage node contact structure 4 and the drain.

Please refer to S23 of FIG. 3 and FIGS. 2 and 17A and 17B. S23 includes forming a storage node contact structure 4 on the top surface of the columnar structure 20.

According to the foregoing embodiments, the source, the conductive channel and the drain are arranged from bottom up in sequence along the columnar structure 20. After the storage node contact structure 4 is formed, the storage node contact structure 4 is in contact with and connected to the drain.

The structure of the storage node contact structure 4 may be selected and set according to actual requirements. Optionally, the storage node contact structure 4 is a metal pad, such as a tungsten pad. As a result, it is ensured that the storage node contact structure 4 has a small resistance value and a high stability.

Please refer to S24 of FIG. 3 and FIGS. 2, 17A and 17B. S24 includes forming a storage capacitor 3 on the storage node contact structure 4.

The structure of the storage capacitor 3 may be selected and set according to actual requirements. Optionally, the storage capacitor 3 is a columnar capacitor, but it is not limited to this. The storage capacitor 3 is a columnar capacitor, which is beneficial to improve the distribution density of the storage capacitor 3 in the semiconductor structure.

Some embodiments of the present disclosure also provide a semiconductor structure, which is prepared by the method for manufacturing a semiconductor structure in some embodiments above. Referring to FIGS. 1, 2, 17A and 17B, the semiconductor structure includes a substrate 11 and a plurality of bit lines 10. A plurality of active areas arranged at intervals are provided in the substrate 11, and the active areas extend in a first direction. The plurality of bit lines 10 are arranged in parallel at intervals in lower parts of the active areas, and there is an air gap 110 between adjacent bit lines 10.

In this embodiment, the air gap 110 is arranged between adjacent bit lines 10. The mutual coupling between bit lines 10 or between a bit line 10 and a gate word line can be effectively eliminated by the air gap 110, thereby effectively reducing a parasitic capacitance between the lines so as to improve the electrical property of semiconductor structures.

The bit lines 10 is prepared by the preparation methods in some of the above embodiments, and the lower surfaces of the bit lines 10 are wavy along their extension direction. In addition, optionally, the material of the bit lines 10 is cobalt silicide. In this way, the bit lines 10 can have a low resistance, which is beneficial to improve the electrical property of semiconductor structures.

In some embodiments, referring to FIGS. 1, 2, 17A and 17B again, the semiconductor structure further includes an insulating isolation structure 5 and a plurality of gate word lines 30. The plurality of gate word lines 30 are located above the bit lines 10, and are arranged in parallel at intervals in a second direction. The second direction intersects with the first direction, such as perpendicular to. The isolation structure 5 is located between adjacent gate word lines 30, and between a gate word line 30 and a bit line 10.

Optionally, the first direction is the column direction, and the second direction is the row direction.

It can be understood that the insulating isolation structure 5 is formed from dielectric layers located between adjacent gate word lines 30 and between a gate word line 30 and a bit line 10. Therefore, according to the preparation methods in some previous embodiments, the insulating isolation structure 5 includes a first dielectric layer 122, a second dielectric layer 22, parts of the materials of which are removed, a third dielectric layer 23, a fourth dielectric layer 24 and a fifth dielectric layer 27. For the materials and structures of the dielectric layers of the insulating isolation structure 5, the related descriptions in the previous embodiments can be referred to, and they will not be described in detail here.

In this embodiment, the insulating isolation structure 5 can effectively seal the air gap 110 between adjacent bit lines 10, and well insulate adjacent gate word lines 30, as well as a gate word line 30 from a bit line 10, thereby reducing a parasitic capacitance between the lines so as to improve the electrical property of semiconductor structures.

In some embodiments, referring to FIGS. 1, 2, 17A and 17B again, the semiconductor structure further includes a columnar structure 20, a source 201, a drain 203 and a conductive channel 202. The columnar structure 20 is located in an active area, the bottom of the columnar structure 20 is in contact with a bit line 10, and the top of the columnar structure 20 penetrates through a gate word line 30 and extends above the gate word line 30. The source 201 is located in the columnar structure 20 and between the gate word line 30 and the bit line 10. The drain 203 is located in the columnar structure 20 and above the gate word line 30. The conductive channel 202 is located in the columnar structure 20 and between the source 201 and the drain 203. The gate word line 30 is located at the periphery of the conductive channel 202. The semiconductor structure further includes a gate dielectric layer 26 located between the conductive channel 202 and the gate word line 30.

According to the preparation methods in some previous embodiments, the source 201 and the drain 203 are obtained by implanting ions into the corresponding regions of the columnar structure 20, respectively.

In one embodiment, the material of the gate word line 30 includes titanium nitride. The gate word line 30 surrounds the periphery of the conductive channel 202.

In one embodiment, the material of the gate dielectric layer 26 includes silicon oxide. The gate dielectric layer 26 may be formed by a thermal oxidation process.

In some embodiments, referring to FIGS. 1, 2, 17A and 17B again, the semiconductor structure further includes a storage node contact structure 4 and a storage capacitor 3. The storage contact structure 4 is located above the columnar structure 20 and is in contact with and connected with the drain 203. The storage capacitor 3 is located above the storage node contact structure 4 and is in contact with and connected with the storage node contact structure 4.

The structure of the storage node contact structure 4 may be selected and set according to actual requirements. Optionally, the storage node contact structure 4 is a metal pad, such as a tungsten pad. As a result, it is ensured that the storage node contact structure 4 has a small resistance value and a high stability.

The structure of the storage capacitor 3 may be selected and set according to actual requirements. Optionally, the storage capacitor 3 is a columnar capacitor, which is beneficial to improve the distribution density of the storage capacitor 3 in the semiconductor structure.

The technical features of the above-mentioned embodiments may be arbitrarily combined. In order to make the description concise, not all possible combinations of the technical features of the above-mentioned embodiments are described. However, as long as there is no contradiction between the combinations of these technical features, the combinations shall be considered within the scope of this specification.

The above-mentioned embodiments only describe several implementation modes of this disclosure, and their descriptions are comparatively specific and detailed, but should not be understood as limiting the scope of the patent disclosure. It should be noted that, for those of ordinary skill in the art, without departing from the concept of this disclosure, several modifications and improvements can be made, all of which are within the scope of protection of this disclosure. Therefore, the scope of protection of this patent disclosure should be subject to the appended claims.

What is claimed is:

1. A semiconductor structure, comprising:
   a substrate, wherein a plurality of active areas arranged at intervals are provided in the substrate, wherein the active areas extend in a first direction;
   a plurality of bit lines arranged at intervals in parallel at the lower parts of the active areas, wherein an air gap is provided between adjacent bit lines;
   a plurality of gate word lines located above the bit lines, wherein the plurality of gate word lines are arranged in parallel at intervals in a second direction, wherein the second direction intersects with the first direction;
   an insulating isolation structure located between adjacent gate word lines, and between a gate word line and a bit line;
   a columnar structure located in an active area, wherein a bottom of the columnar structure is in contact with the bit line, and a top of the columnar structure penetrates through the gate word line and extends above the gate word line;

a source located in the columnar structure and between the gate word line and the bit line;

a drain located in the columnar structure and above the gate word line; and a conductive channel located in the columnar structure and between the source and the drain, wherein the gate word line is located at a periphery of the conductive channel.

2. The semiconductor structure according to claim 1, further comprising: a gate dielectric layer located between the conductive channel and the gate word line.

3. The semiconductor structure according to claim 1, wherein a material of the gate word lines is titanium nitride.

4. The semiconductor structure according to claim 1, further comprising:

a storage node contact structure located above the columnar structure and being in contact with and connected with the drain; and a storage capacitor located above the storage node contact structure and being in contact with and connected with the storage node contact structure.

5. The semiconductor structure according to claim 1, wherein a material of the bit lines is cobalt silicide.

* * * * *